(12) United States Patent
Ghandehari et al.

(10) Patent No.: US 8,309,457 B2
(45) Date of Patent: Nov. 13, 2012

(54) MULTILAYER LOW REFLECTIVITY HARD MASK AND PROCESS THEREFOR

(75) Inventors: Kouros Ghandehari, Santa Clara, CA (US); Anna M. Minvielle, San Jose, CA (US); Marina V. Plat, San Jose, CA (US); Hirokazu Tokuno, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/283,076

(22) Filed: Oct. 27, 2011

(65) Prior Publication Data

US 2012/0045888 A1   Feb. 23, 2012

Related U.S. Application Data

(62) Division of application No. 12/468,715, filed on May 19, 2009, now Pat. No. 8,048,797, which is a division of application No. 11/098,262, filed on Apr. 4, 2005, now Pat. No. 7,538,026.

(51) Int. Cl.
*H01L 21/4763* (2006.01)
(52) U.S. Cl. .. 438/636; 438/737; 438/742; 257/E21.495
(58) Field of Classification Search .................. 438/636, 438/736, 737, 742
See application file for complete search history.

(56) References Cited

U.S. PATENT DOCUMENTS

| | | | |
|---|---|---|---|
| 5,264,076 | A | 11/1993 | Cuthbert et al. |
| 5,773,199 | A | 6/1998 | Linliu et al. |
| 5,837,428 | A | 11/1998 | Huang et al. |
| 5,858,621 | A | 1/1999 | Yu et al. |
| 6,080,678 | A | 6/2000 | Yim |
| 6,096,659 | A | 8/2000 | Gardner et al. |
| 6,136,679 | A | 10/2000 | Yu et al. |
| 6,156,629 | A | 12/2000 | Tao et al. |
| 6,218,292 | B1 | 4/2001 | Foote |
| 6,221,776 | B1 | 4/2001 | Smith |
| 6,297,170 | B1 | 10/2001 | Gabriel et al. |
| 6,352,922 | B1 | 3/2002 | Kim |
| 6,365,529 | B1 | 4/2002 | Hussein et al. |
| 6,410,421 | B1 | 6/2002 | Ghandehari et al. |
| 6,894,342 | B1 | 5/2005 | Hui et al. |
| 6,995,437 | B1 | 2/2006 | Kinoshita et al. |
| 7,235,471 | B2 | 6/2007 | Jawarani et al. |
| 2004/0018739 | A1 | 1/2004 | Abooameri et al. |
| 2004/0092089 | A1 | 5/2004 | Thakar et al. |
| 2004/0197707 | A1 | 10/2004 | Yamanaka et al. |

*Primary Examiner* — Alexander Ghyka
(74) *Attorney, Agent, or Firm* — Meyertons, Hood, Kivlin, Kowert & Goetzel, P.C.

(57) ABSTRACT

A method utilizing a multilayer anti-reflective coating layer structure can achieve low reflectivity at high numerical apertures. The multilayer anti-reflective coating structure can be utilized as a hard mask forming various integrated circuit structures. A multilayer anti-reflective coating structure can be utilized to form gate stacks comprised of polysilicon and a dielectric layer. A photoresist is applied above the multilayer anti-reflective coating which can include silicon oxynitride (SiON) and silicon rich nitride (SiRN).

10 Claims, 49 Drawing Sheets

MULTILAYER LOW REFLECTIVITY HARD MASK AND PROCESS THEREFOR

This application is a divisional application of U.S. patent application Ser. No. 12/468,715, entitled "MULTILAYER LOW REFLECTIVITY HARD MASK AND PROCESS THEREFOR", filed May 19, 2009, now U.S. Pat. No. 8,048,797 which is a divisional application of Ser. No 11/098,262, now U.S. Pat. No. 7,538,026, entitled "MULTILAYER LOW REFLECTIVITY HARD MASK AND PROCESS THEREFOR", filed Apr. 4, 2005.

FIELD OF THE INVENTION

The present specification relates to the fabrication of integrated circuits (ICs). More specifically, the present specification relates to a hard mask process for forming integrated circuit features.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of devices on an IC, there is still a need to decrease the size of IC device features, and, thus, increase the number of devices on an IC.

One limitation to the smallness of IC critical dimensions is conventional lithography. In general, projection lithography refers to processes for pattern transfer between various media. According to conventional projection lithography, a silicon slice, the wafer, is coated uniformly with a radiation-sensitive film or coating, the photoresist. An exposing source of radiation illuminates selected areas of the surface through an intervening master template, the mask, for a particular pattern. The radiation can be light, such as ultra-violet light, vacuum ultra-violet (VUV) light and deep ultraviolet light. The radiation can also be x-ray radiation, e-beam radiation, etc.

The lithographic photoresist coating is generally a radiation-sensitive coating suitable for receiving a projected image of the subject pattern. Once the image is projected, it is indelibly formed in the coating. The projected image may be either a negative or a positive image of the subject pattern.

Exposure of the lithographic coating through a photomask or reticle causes the image area to become selectively either more or less soluble (depending on the negative or positive photoresist coating) in a particular developer. The more soluble areas are removed in the developing process to leave the pattern image in the coating as less soluble polymer.

The photoresist material or layer associated with conventional lithographic technologies is often utilized to selectively form various IC structures, regions, and layers. Generally, the patterned photoresist material can be utilized to define doping regions, implant regions or other structures associated with an integrated circuit (IC). A conventional lithographic system is often utilized to pattern photoresist material to form gate stacks or structures. As the features in semiconductor patterning become smaller and smaller, the photoresist thickness needed to sustain reasonable aspect ratio must decrease. A thinner photoresist may not be suitable for etch applications due to premature resist erosion. Thus, resist erosion complications facilitate the necessity for hard mask processes.

According to one conventional process, a hard mask is provided above polysilicon/oxide layers to pattern the gate stacks. The hard mask must be thin enough so that it can be etched without eroding the patterned photoresist above it. The hard mask must also be thick enough to withstand an etch process so that uncovered portions of the underlying layer (e.g., polysilicon layer) can be completely removed. Accordingly, the hard mask must have a precise thickness to appropriately pattern the gate stacks.

An anti-reflective coating (ARC) has been conventionally provided underneath the photoresist material or the hard mask to reduce reflectivity and thereby, reduce resist notching, lifting and variation of critical dimension of the obtained pattern. Generally, the ARC (organic or inorganic) is a relatively thin layer which cannot be used as a hard mask because it is too thin and does not allow thickness flexibility due to optical design parameters.

Advanced lithography is utilizing higher numerical apertures (NA) to achieve smaller feature sizes. However, the use of higher NA affects the reflectivity of the ARC. The effects on reflectivity associated with higher NAs makes designing a optimal thicknesses for an ARC more difficult. For example, reflectivity requirements due to the use of higher NA's and thickness requirements for bottom anti-reflective coatings (BARCs) are not coincident.

Thus, there is a need to pattern IC devices using non-conventional lithographic techniques. Further, there is a need for a process of forming a gate stack that does not require a conventional hard mask step. Yet further, there is a need for a hard mask that has low reflectivity at high NA. Even further still, there is a need for a gate mask process that effectively balances optical and etching efficiencies, especially at ultra high NA. Yet even further still, there is a need for a dual layer hard mask that has less than 1% reflectivity at high NAs and can be used with dual poly flow processes.

SUMMARY OF THE INVENTION

An exemplary embodiment relates to a method of fabricating an integrated circuit. The method includes providing a first anti-reflective coating layer including SiOC, SiRN or SiON above a substrate; providing a second anti-reflective coating layer including SiON or SiOC above the first anti-reflective coating; providing a photoresist layer above the second anti-reflective coating layer; patterning the photoresist layer. A first thickness of the first anti-reflective coating and a second thickness of the second anti-reflective coating are configured to reduce reflections associated with the patterning step to below 0.2 percent. The method further includes removing the first anti-reflective coating layer and the second anti-reflective coating layer in accordance with a feature defined by the photoresist layer.

Another exemplary embodiment relates to a method of forming a gate stack for an integrated circuit. The method includes providing a first anti-reflective coating layer and a second anti-reflective coating layer over a gate conductor layer. The second anti-reflective coating layer includes silicon, oxygen and nitrogen. The first anti-reflective coating layer includes silicon and nitrogen. The method also includes steps of providing a photoresist layer over the second anti-reflective coating layer, and patterning the photoresist layer to form a first feature in the photoresist layer at a high numerical aperture.

Still another exemplary embodiment relates to a method of forming a hard mask for an integrated circuit. The method includes steps of providing a dual layer anti-reflective coating above a substrate, the coating including at least silicon oxynitride and silicon rich nitride. The method also includes steps of providing a photoresist layer above the dual layer antireflective coating, patterning the photoresist layer to form a feature, and selectively removing the dual layer anti-reflective coating in accordance with the photoresist feature.

Another exemplary embodiment relates to a method of forming a hard mask for an integrated circuit. The method includes providing a dual layer anti-reflective coating above a substrate, providing a photoresist layer above the dual layer anti-reflective coating, and patterning the photoresist layer to form a feature. The method also includes selectively removing the dual layer anti-reflective coating in accordance with the photoresist feature. The coating includes at least one spin-on organic anti-reflective material and at least one of a silicon nitride ($Si_3N_4$), carbon doped silicon oxide (SiOC), silicon oxynitride (SiON), and silicon rich nitride (SiRN) layer.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
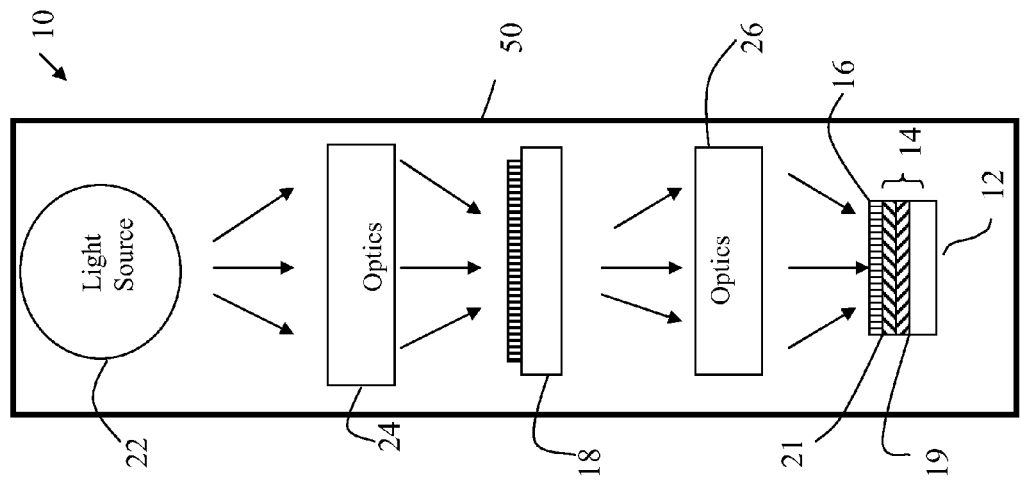
FIG. 1 is a general schematic block diagram of a lithographic system for processing a substrate according to an exemplary embodiment.

Referring to FIG. 1, a substrate 12 is shown in a lithographic system 10. Substrate 12 can be a semiconductor substrate, such as, silicon, gallium arsenide, germanium, or other substrate material. Substrate 12 can include one or more layers of material and/or features, such as, lines, interconnects, vias, doped portions, etc., and can further include devices, such as, transistors, microactuators, microsensors, capacitors, resistors, diodes, etc. Substrate 12 can be an entire IC wafer or part of an IC wafer. Substrate 12 can be part of an integrated circuit, such as, a memory, a processing unit, an input/output device, etc.

Lithographic system 10 provides a pattern of radiation to substrate 12. System 10 can include a chamber 50. Chamber 50 can be a vacuum or low pressure chamber for use in UV, deep UV, or VUV lithography. Chamber 50 can contain any of numerous types atmospheres, such as, nitrogen, etc. Alternatively, lithographic system 10 can be utilized in various other types of lithography including lithography that uses radiation at any number of wavelengths.

Lithographic system 10 includes a light source 22, a condenser lens assembly 24, a reticle or a mask 18, and an objective lens assembly 26. System 10 can include a stage that supports substrate 12 and can move substrate 12 with respect to lens assembly 26. System 10 can have a variety of configurations and arrangements. The configuration of system 10 shown in FIG. 1 is exemplary.

System 10 can include mirrors, beam splitters, and other components arranged according to other designs. System 10 can be embodied as a lithographic camera or stepper unit. An example of lithographic system 10 is a PAS5500/1250 series machine manufactured by ASML. Other examples include Microscan DUV systems by Silicon Valley Group or an XLS family Microlithography System by Integrated Solutions, Inc. of Korea. Most preferably, system 10 is a tool that has varying numerical aperture (NA) such as 11250 (0.85) and V400 (0.93) manufactured by ASML.

Substrate 12 can include one or more layers of material thereon. The layers can be insulative layers, conductive layers, barrier layers, or other layers of material which are to be etched, or selectively removed using the process described herein.

In one embodiment, the layers above substrate 12 are a dielectric layer and a gate conductor layer used to form a gate stack. The dielectric layer can be a gate oxide and the gate conductor layer can be polysilicon or metal. The gate stack is configured using the process described below. Various integrated circuit features may be fabricated using the method described below.

Substrate 12 and subsequent layers of material are not described in a limiting fashion. The principles of the present invention can be applied to any integrated circuit substrate, wafer, mask layer, or other layer. Substrate 12 can be conductive, semiconductive, or insulative.

A layer of lithographic material, such as, a photoresist layer or material 16 is deposited or applied over a multilayer anti-reflective coating structure 14. In one embodiment, multilayer anti-reflective coating structure 14 can be dual layer structure including an anti-reflective coating layer 19 and anti-reflective coating layer 21. Structure 14 preferably serves as a hard mask for subsequent etching of layers above substrate 14 as well as a coating for optically enhancing resolution by reducing reflections. Thickness and materials for layers 19 and 21 are chosen so structure 14 is thin enough to be etched without eroding material 16 and yet thick enough to provide critical dimension control and to withstand the etching of layers underneath structure 14.

Photoresist material 16 can comprise any of a variety of photoresist chemicals suitable for lithographic applications. Material 16 can be comprised of a matrix material or resin, a sensitizer or inhibitor, and a solvent. Photoresist material 16 is preferably a high-contrast photoresist, but may alternatively be a low-contrast photoresist.

Photoresist material 16 is deposited by, for example, spin-coating over layer of structure 14. Material 16 can be provided with a thickness of less than 0.5 microns. Preferably, photoresist material 16 has a thickness between 0.1 and 0.5 microns. Further, photoresist material 16 may be either a positive photoresist or a negative photoresist and can be a multilayer resist material.

Preferably, the size of features provided to layers 19 and 21, such as periphery and core features, give imaging at varying effective NA's. For 65 nanometer generations and beyond, extremely low reflectivity can be obtained by utilizing dual layer BARC hard masks, such as layers 19 and 21 described below.

With reference to FIGS. 1-10, an exemplary process for forming a gate stack or structure is described below as follows. The process advantageously provides a hard mask with good critical dimension control and anti-reflective coating characteristics.

Figure 2:
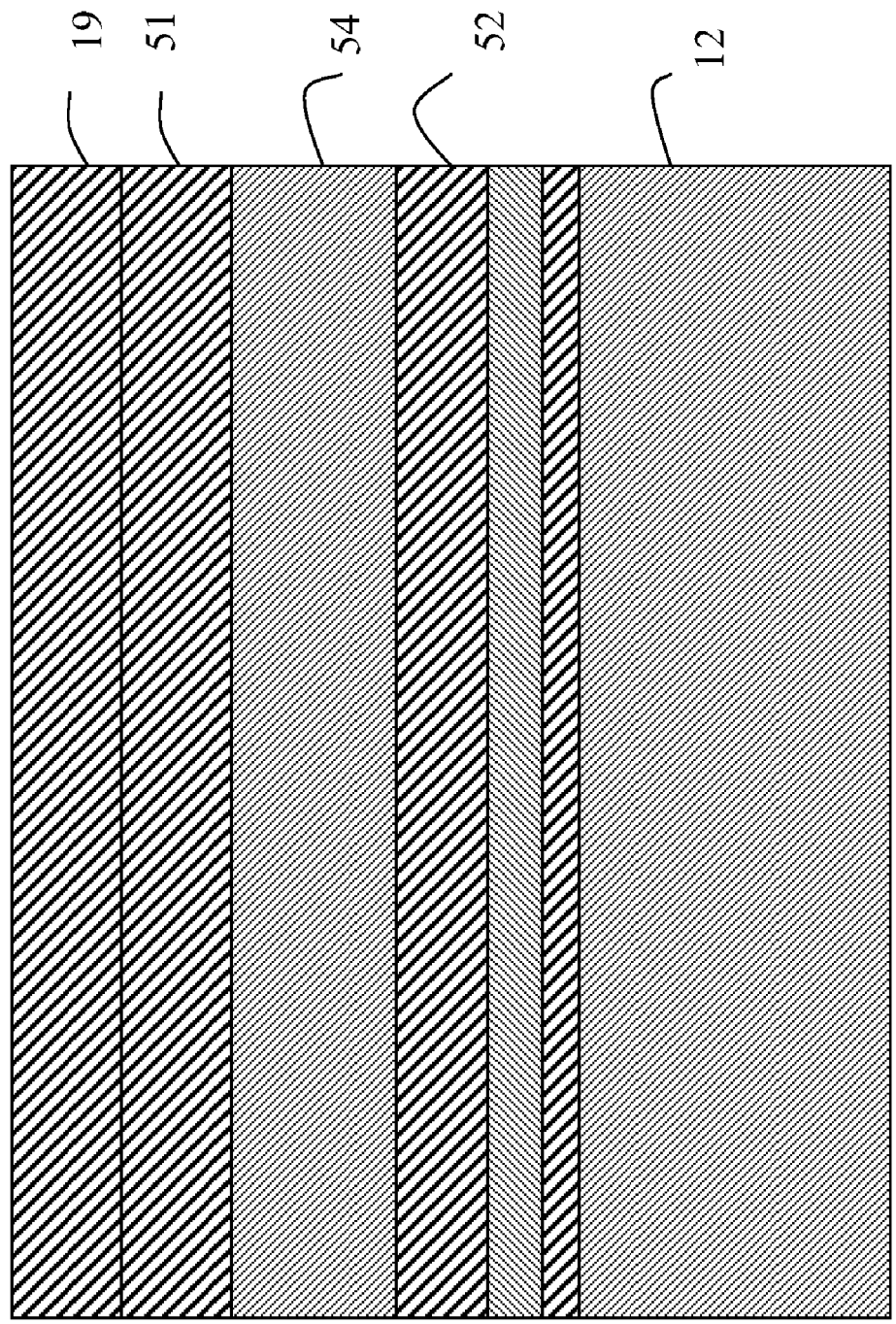
FIG. 2 is a schematic cross-sectional view of the substrate illustrated in FIG. 1, showing a first anti-reflective coating deposition step in accordance with an exemplary embodiment.

With reference to FIG. 2, substrate 12 includes a dielectric layer 52 and a gate conductor layer 54. Layers 52 and 54 are a conductive/dielectric stack for the formation of a gate structure. Layers 52 and 54 can have a variety of thicknesses and be manufactured from a variety of materials.

In one embodiment, gate conductor layer 54 is poly 2 layer for a flash device. Layer 54 can be a 500-2000 Å thick polysilicon layer and layer 52 can be a 200 to 1000 Å thick silicon dioxide or silicon nitride layer. Layers 52 and 54 form a polysilicon oxide pillar.

In one embodiment, a layer 51 of hard mask (HM) oxide material or other insulator can be deposited by furnace deposition or CVD above layer 54. Preferably, layer 51 is approximately 300-700 Å thick of oxide material (e.g., $SiO_2$). Layer 54 can be deposited by chemical vapor deposition (CVD) above layer 52. Layer 52 can be grown or deposited (CVD) above substrate 12.

Figure 10:
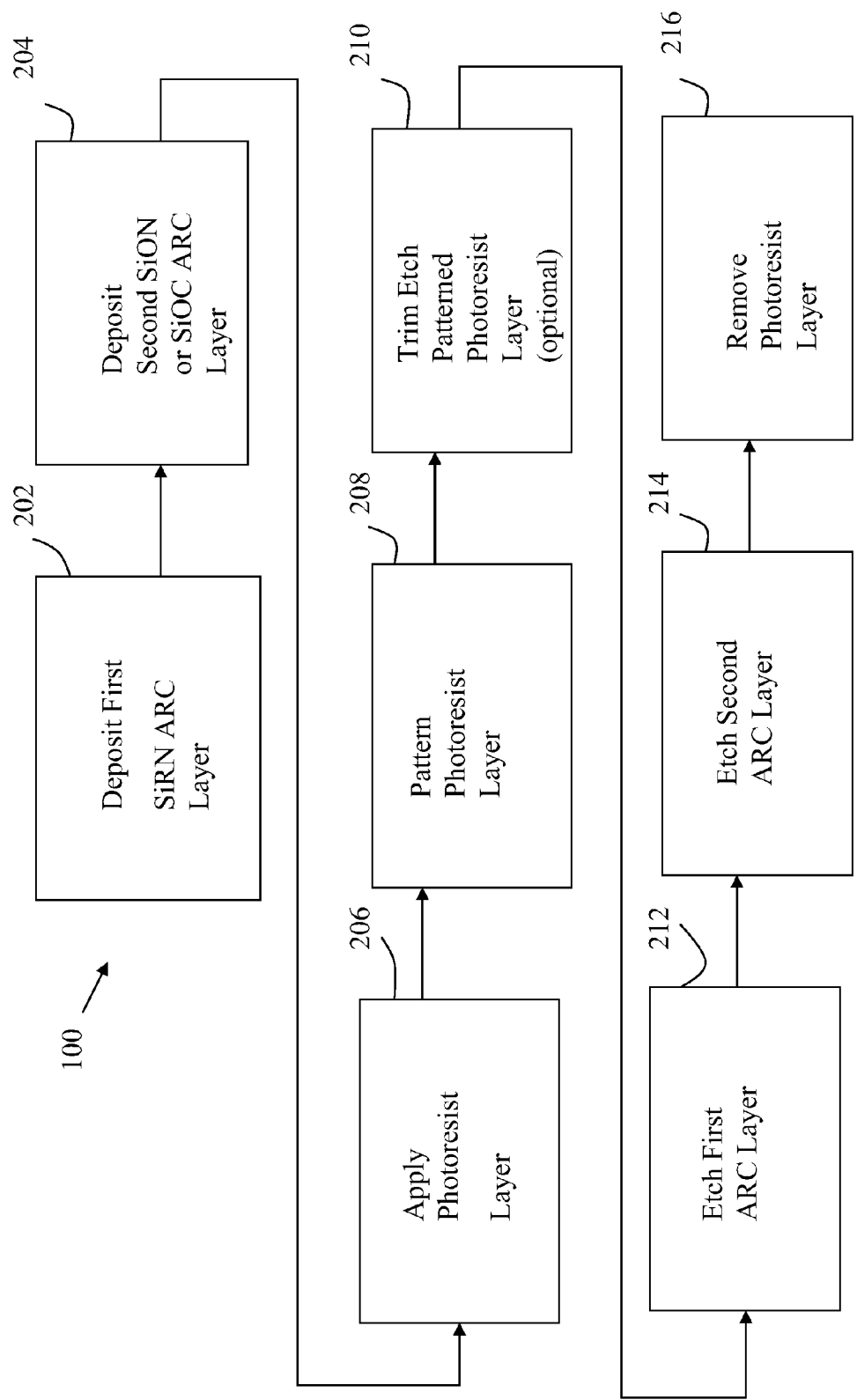
FIG. 10 is flow diagram showing a multilayer anti-reflective coating layer process of etching a substrate or a layer above a substrate.

An anti-reflective coating layer 19 is provided above layer 54 in a step 202 of process 100 (FIG. 10). Anti-reflective coating layer 19 can be deposited by CVD or diffusion furnace. In one embodiment, layer 19 is deposited as a 200-1000 Å thick layer of silicon rich nitride (SiRN) or $Si_3N_4$.

Figure 3:
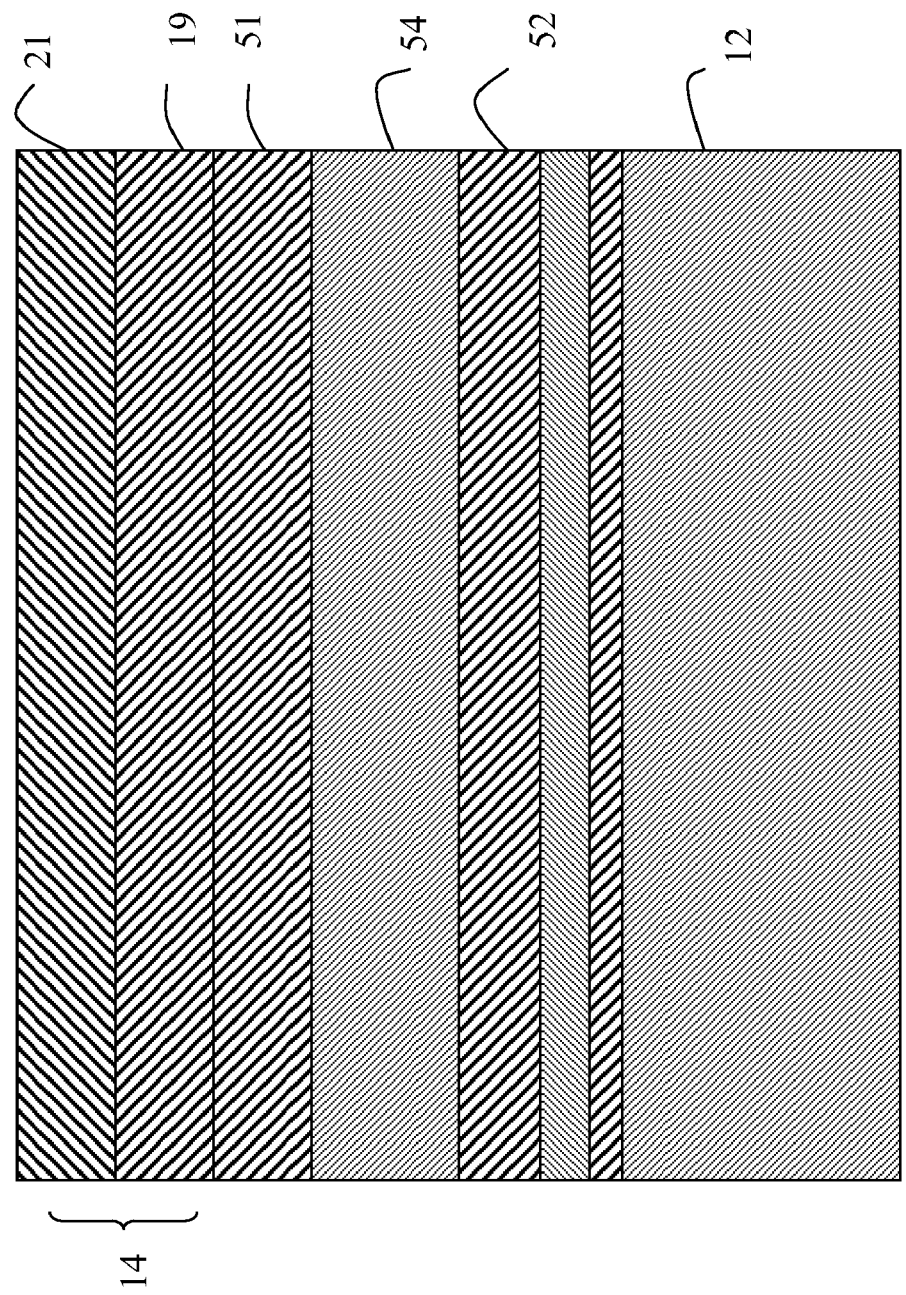
FIG. 3 is a schematic cross-sectional view of the substrate illustrated in FIG. 2, showing a second anti-reflective coating layer deposition step in accordance with an exemplary embodiment.

With reference to FIG. 3, an anti-reflective coating layer 21 is deposited above anti-reflective coating layer 19 in a step 204 of process 100. Layer 21 can be deposited by CVD or deposited by spin-on deposition. The combination of layers 19 and 21 forms a multilayer or bi-layer ARC that also can be used as a hard mask for selectively removing layers 52 and 54 to form gate stacks. In one embodiment, layer 21 is a 250 Å thick layer of silicon oxynitride (SiON). Alternative materials and thickness for layers 19 and 21 may be available.

According to other embodiments, layers 19 and 21 (structure 14) can be SiON over SiON, SiON over SiOC, spin-on organic (n=1.8, k=0.35) over SiRN (300-1000 Å), spin-on organic over any of SiON, SiOC or $Si_3N_4$. The spin-on organic can have a k value ranging from k=0.3-0.55. $Si_3N_4$ preferably has a k value greater than the conventional value of 0.22 (e.g., has a value of 0.25-0.35). In one preferred embodiment, layer 19 is SiRN or SiON and layer 21 is spin-on organic anti-reflective material with n=1.8 and k=0.3-0.55.

The thickness of layers 19 and 21 are chosen in accordance with optical parameters associated with system 10. Preferably, the thickness of layers 19 and 21 are chosen so that the combination of layers 19 and 21 has an anti-reflective effect and yet have a thickness requirement suitable for use as a hard mask. In a preferred embodiment, the thickness is chosen to be thick enough to avoid erosion when layer 54 is etched and yet thin enough so that photoresist material is not eroded when layers 19 and 21 are etched.

System parameters and design considerations can affect the selection of dimensions and materials for layers 19 and 21. For example, the wavelength of radiation used by system 10 (FIG. 1) can affect the selection of materials and thicknesses for layers 19 and 21. In one embodiment, system 10 uses radiation having a wavelength of 248 nm, layer 19 is a 400 Å thick layer of organic CVD ARC and layer 21 is a 200 Å thick layer of Si rich nitride. Layers 19 and 21 can be the same material as each other or different materials from each other.

Applicants have found that according to one embodiment, simulations show that the thinnest dual BARC layer (layers 19 and 21) with optimal conditions is 250 Å top SiON and 300 Å bottom SiRN. The dual BARC layer is provided above a 450 Å layer (300-700 Å thick) of oxide HM (layer 51 which is provided over a 500 Å layer of polysilicon (layer 54)). Applicants have found that the oxide thickness associated with layer 52 does not appear to affect the process. The polysilicon layer (layer 54) is preferably a poly 2 layer for a flash gate stack.

In one particular embodiment, layer 54 is a polysilicon layer (500-1500 Å and preferably has a 600 Å thickness. Layer 19 is a 400 Å thick SiRN (N=2.664, K=0.25), and layer 21 is a 300 Å thick layer of SiON (N=1.8, K=0.35). Preferably, reflectivities are achievable well below 1% (0.0005-0.0803%).

Examples of other particular embodiments are shown in Table 1 below. The coefficients of refraction are represented by n and k where n+ik represents the complex index of refraction. Lithography is performed at a wavelength of 193 nm. The underlying layer in Table I is the layer below layer 19.

TABLE 1

| | | Layer 19 | | | Layer 21 | | | Underlying |
|---|---|---|---|---|---|---|---|---|
| Example | Material | k | n | Thickness | Material | n | k | Thickness | Layers |
| 1 | SiRN | 0.35 | 2.6 | 400 Å | SiON | 1.8 | 0.35 | 300 Å | Poly |
| 2 | SiRN | 0.35 | 2.6 | 400 Å | SiOC (N free) | 1.8 | 0.35 | 300 Å | Poly |
| 3 | $Si_3N_4$ | 0.25 to 0.35 | 2.6 | 400 Å | SiON | 1.8 | 0.35 | 300 Å | Poly |
| 4 | $Si_3N_4$ | 0.25 to | 2.6 | 400 Å | SiOC (N free) | 1.8 | 0.35 | 300 Å | Poly |

TABLE 1-continued

| Example | Layer 19 | | | | Layer 21 | | | | Underlying Layers | |
|---|---|---|---|---|---|---|---|---|---|---|
| | Material | k | n | Thickness | Material | n | k | Thickness | | |
| 5 | SiRN | 0.35 1.05 | 2.2 | 400 Å | SiON | 1.8 | 0.35 | 300 Å | HM 100-1000 Å | Poly |
| 6 | SiRN | 1.05 | 2.2 | 400 Å | SiOC (N free) | 1.8 | 0.35 | 300 Å | HM 100-1000 Å | Poly |
| 7 | SiRN | 1.05 | 2.2 | 400 Å | Organic spin-on AR40 | 1.8 | 0.30 to 0.55 | 300 Å | HM | |
| 8 | SiRN | 1.05 | 2.2 | 400 Å | SiON | 1.8 | 0.5 | 300 Å | Poly | |
| 9 | SiRN | 1.05 | 2.2 | 400 Å | SiOC (N free) | 1.8 | 0.5 | 300 Å | Poly | |
| 10 | SiRN | 1.05 | 2.2 | 400 Å | Organic spin-on AR40 | 1.8 | 0.30 to 0.55 | 300 Å | Poly | |

Figure 4:
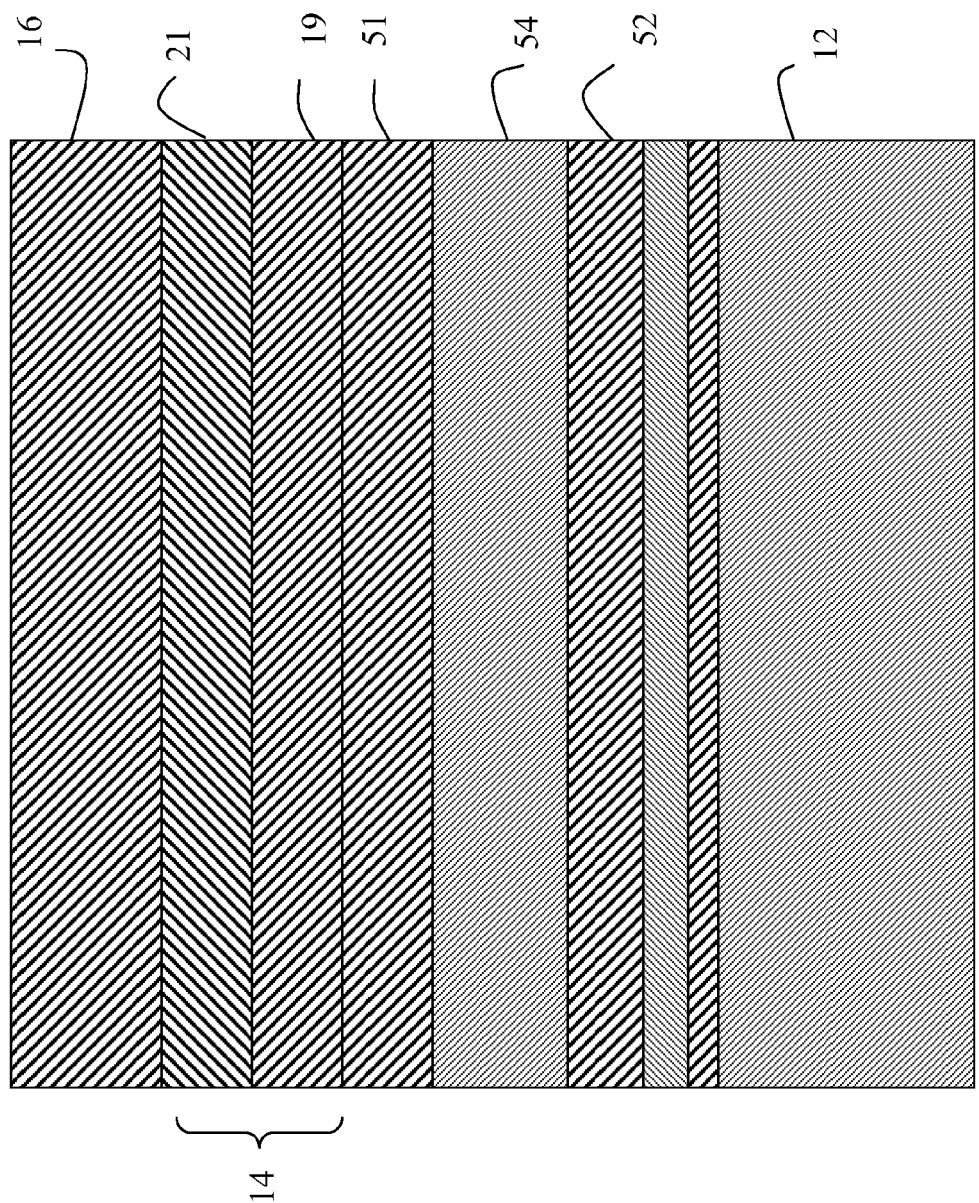
FIG. 4 is a schematic cross-sectional view of the substrate illustrated in FIG. 3, showing a photoresist layer application step in accordance with an exemplary embodiment.

With reference to FIG. 4, a layer of photoresist material 16 is applied above multilayer structure 14 in a step 206 of process 100. Material 16 can be applied by spin coating to a thickness of 100-5000 Å. Material 16 can be a 2000 Å ArF resist.

Figure 5:
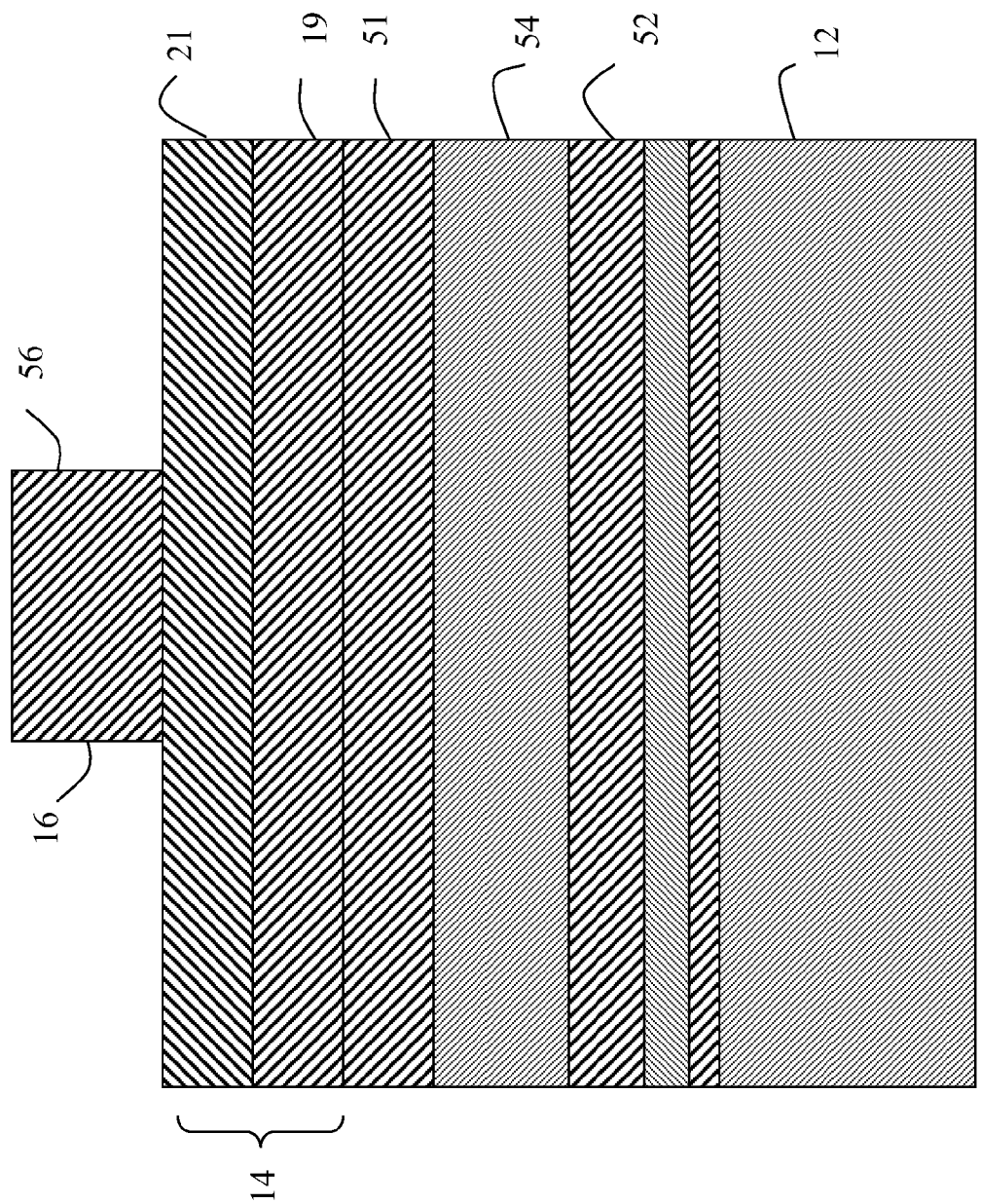
FIG. 5 is a schematic cross-sectional view of the substrate illustrated in FIG. 4, showing a photoresist patterning step in accordance with an exemplary embodiment.

With reference to FIG. 5, photoresist material 16 is configured to have a feature 56 according to a conventional lithographic process in a system, such as, system 10. The lithographic process advantageously utilizes the anti-reflective characteristics of structure 14 in a step 208 of process 19.

In one embodiment reticle 18 (FIG. 1) is utilized to pattern feature 56 in material 16. After exposure to radiation in system 10, material 16 is developed to leave feature 56. In one embodiment, the pattern can be for printing lines, feature 56 representing the line width of one line.

Figure 6:
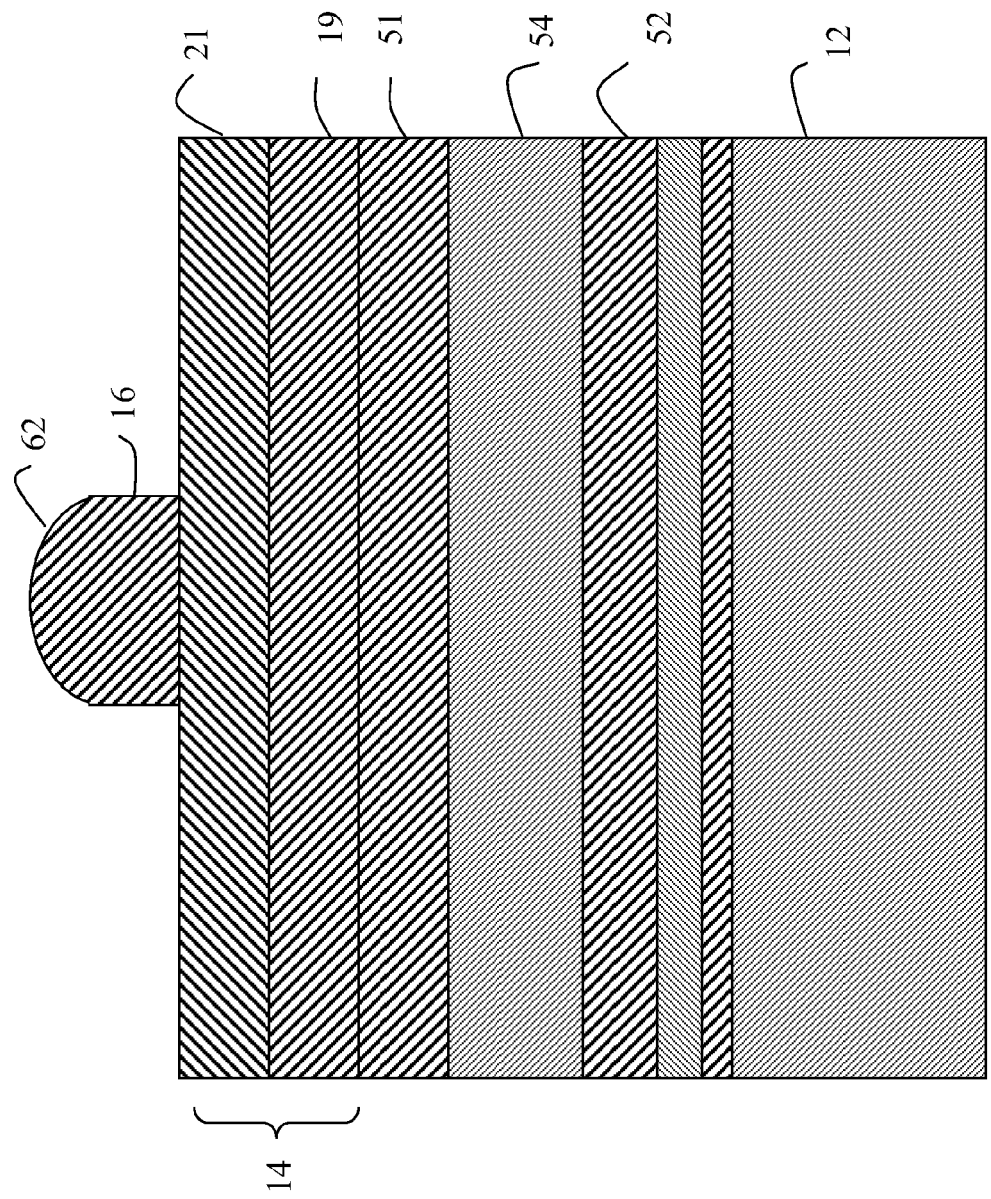
FIG. 6 is a schematic cross-sectional view of the substrate illustrated in FIG. 5, showing a trim etching step in accordance with an exemplary embodiment.

With reference to FIG. 6, material 16 is subjected to a trim etching process to reduce its dimension in a step 210 of process 100. After the trim etching process, material 16 includes a feature 62. Feature 62 has a width less than the width of feature 56 (FIG. 5). The trim etching process is described as an optional step and is not necessary to achieve the advantages of the present invention.

Figure 7:
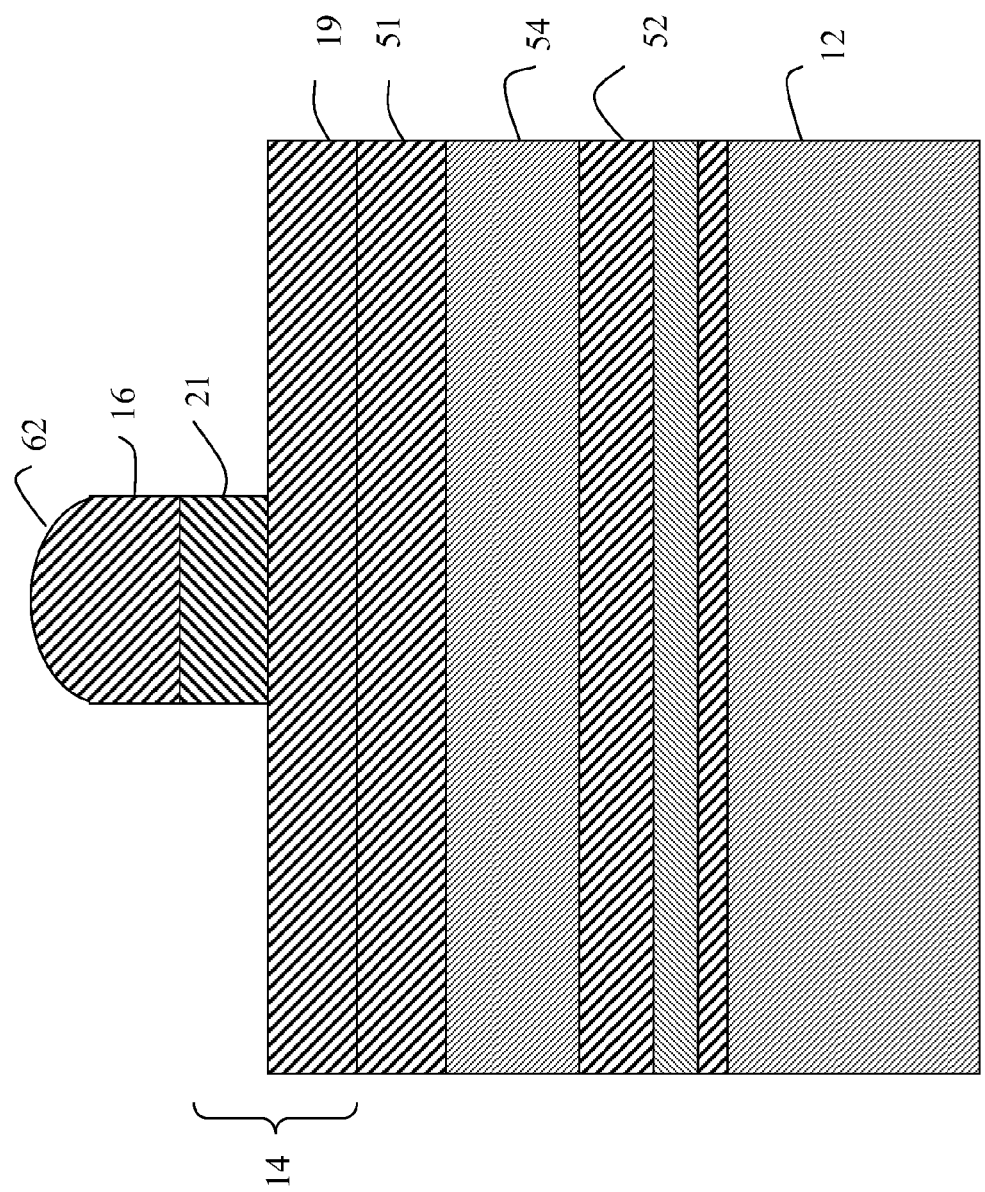
FIG. 7 is a schematic cross-sectional view of the substrate illustrated in FIG. 6, showing a first anti-reflective coating layer etching step in accordance with an exemplary embodiment.

With reference to FIG. 7, layer 21 is removed in accordance with feature 16 in a step 212 of process 100. Preferably, a dielectric etching process is utilized to remove layer 21. The etching process can be selective to material 21 with respect to material 16. If materials associated with layers 19 and 21 have different etch selectivity, material 16 can be removed after layer 21 is etched. Alternatively, if layers 19 and 21 have similar etch selectivity, material 16 is not removed until after layer 19 is etched.

Figure 8:
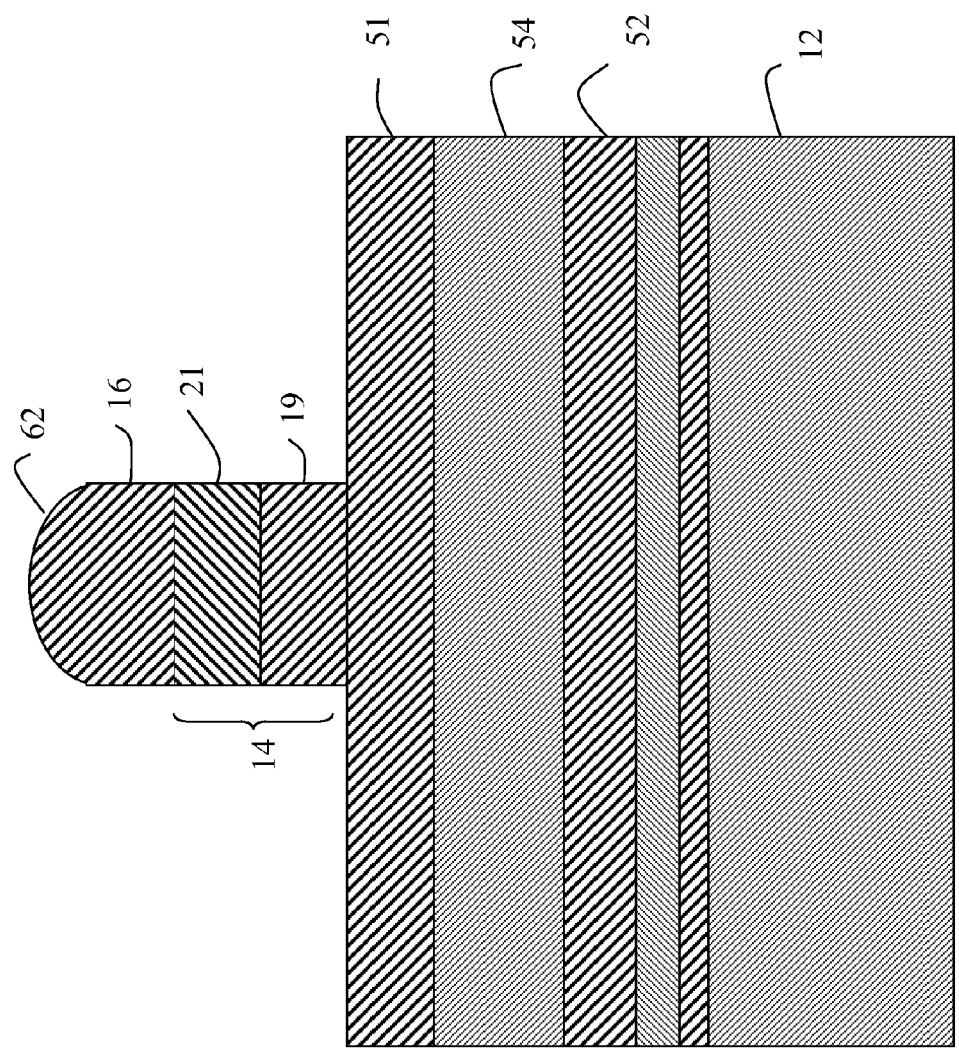
FIG. 8 is a schematic cross-sectional view of the substrate illustrated in FIG. 7, showing a second anti-reflective coating layer etching step in accordance with an exemplary embodiment.

With reference to FIG. 8, layer 19 is etched in accordance with feature 16 in a step 214 of process 100. Layer 19 can be etched in a process similar to the process used to etch layer 21. In one embodiment, layers 19 and 21 can be simultaneously etched. Preferably, layer 19 is etched in a process selective to the material of layer 19 with respect to gate conductor layer 54.

Figure 9:
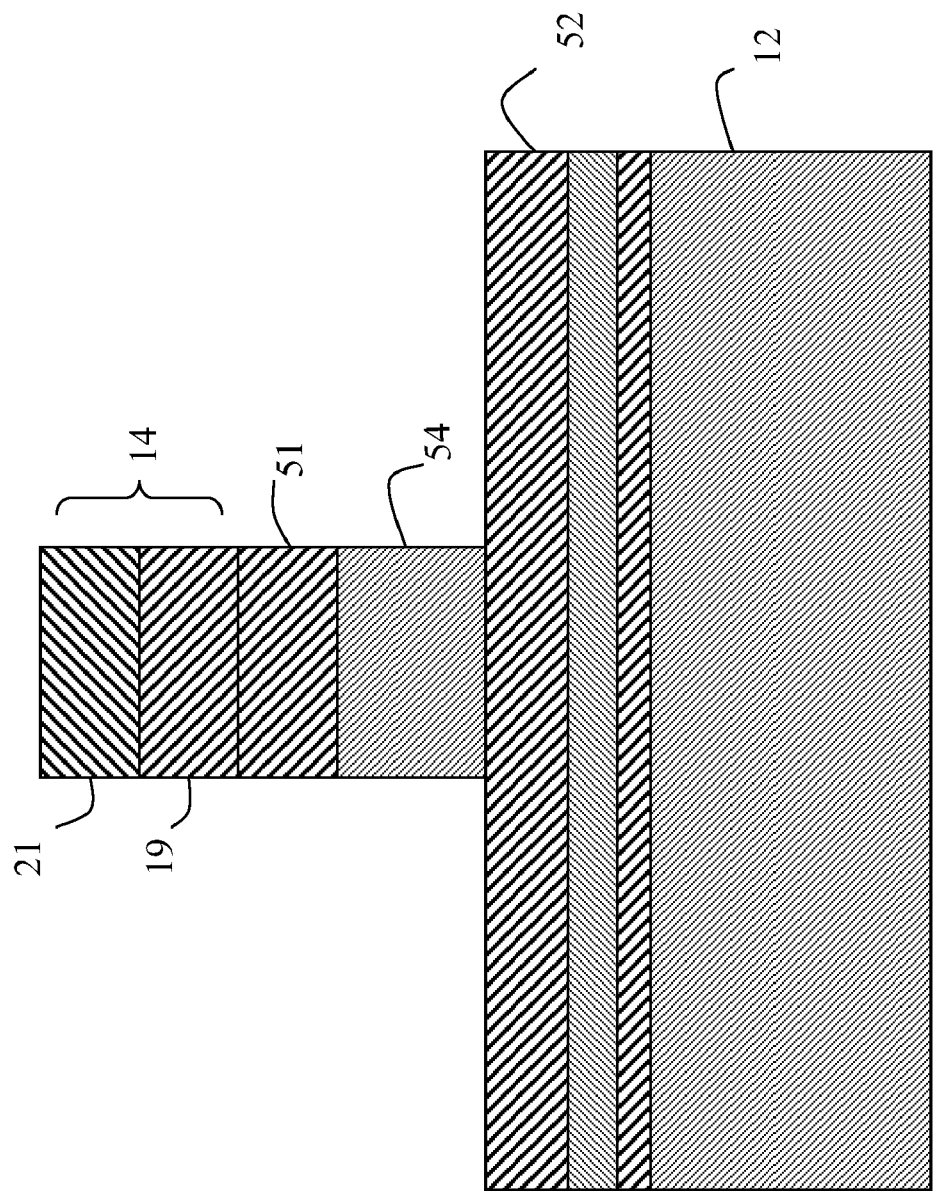
FIG. 9 is a schematic cross-sectional view of the substrate illustrated in FIG. 8, showing a gate stack etching step in accordance with an exemplary embodiment.

With reference to FIG. 9, material 16 (FIG. 8) is removed and gate conductor layer 54 and dielectric layer 52 are etched. Alternatively, photoresist layer 16 can remain during the etching of layers 54 and 52.

Gate conductor layer 54 can be etched in a dry etching process selective to layer 54 with respect to layer 19 and layer 21. After layer 54 is etched, layer 52 can be etched in a dry etching process selective to layer 52 with respect to layers 21 and 19.

Material 16 can be removed in an ashing process in a step 216 process 100. For example, a conventional ashing process utilizing an $O_2$ plasma can remove material 16. Alternatively, other removal processes such as wet strip can strip material 16. Gate conductor layer 54 and dielectric layer 52 are etched utilizing structure 14 as a hard mask.

Various design criteria can be utilized for layers 19 and 21. For example, a designer can chose the required total thickness of structure 14 to appropriately etch layers 54 and 52. Knowing the optical characteristics of materials for layers 19 and 21, the thickness of layers 19 and 21 can be chosen to achieve the desired optical characteristics.

According to one preferred embodiment, a spacer layer is provided above layers 19 and 21 after etching and after material 16 is removed. The spacer layer is etched to leave spacer material in the holes of the pattern. The spacer layer is utilized to reduce the size of holes associated with the pattern in layers 19 and 21. The spacer layer can be provided before or after material 16 and layer 21 is removed. The remaining portions of layers 19 and 21 and the spacer layer are used as a mask to etch layer 54.

Various materials can be used for the spacer layer. The spacer layer can be made from materials similar to layers 19 and 21 (e.g., SiON, SiRN, oxide, etc.). The thickness of the spacer layer is chosen in accordance with spacer geometries.

With reference to FIG. 10, flow diagram 200 describes a process for forming a hard mask utilizing structure 14 (FIG. 1). At a step 202, a first anti-reflective coating (ARC) layer, such as layer 19 is deposited above a substrate. At a step 204, a second ARC layer is deposited above the first ARC layer. The second ARC layer can be a layer such as layer 21 (FIG. 3). As discussed above, the materials and thickness of the first and second ARC layers are chosen to have superior optical properties and yet operate as a hard mask.

At a step 206, a photoresist layer is applied over the second ARC layer. The photoresist layer can be photoresist material 16 (FIG. 1). At a step 208, the photoresist layer is patterned in a lithographic system such as system 10. At a step 210, the photoresist layer is trim etched to form a feature such as feature 62 (FIG. 8) having a smaller critical dimension. At a step 212, the first ARC layer is etched. At a step 214, the second ARC layer is etched. At a step 216, the photoresist layer is removed. The first and second ARC layers can be utilized as the hard mask for forming integrated circuit structures such as gate stacks.

Preferably, layer 19 is removed during etch and layer 21 (bottom SiRN layer) is a hard mask layer for spacer processes in a dual polyflow. In addition, layer 51 can serve as a hard mask for the spacer process for dual polyflow. As described above, the spacer process allows a pattern to be formed with smaller holes.

FIGS. 11-49 show graphs detailing characteristics associated with layers 19, 21, 51, 52 and 54 using lithography at a wavelength of 193 nm. In the FIGS. 11-49, layer #2 refers to layer 21, layer #3 refers to layer 19, layer #1 refers to photoresist material 16, layer #4 refers to oxide layer 51, and layer #5 refers to layer #54. The underlying oxide layer refers to the insulative layer below layer 54 (layer 52). The characteristics shown in FIGS. 11-49 are not provided in a limiting fashion unless those characteristics are specifically and literally recited in the claims.

Figure 11:
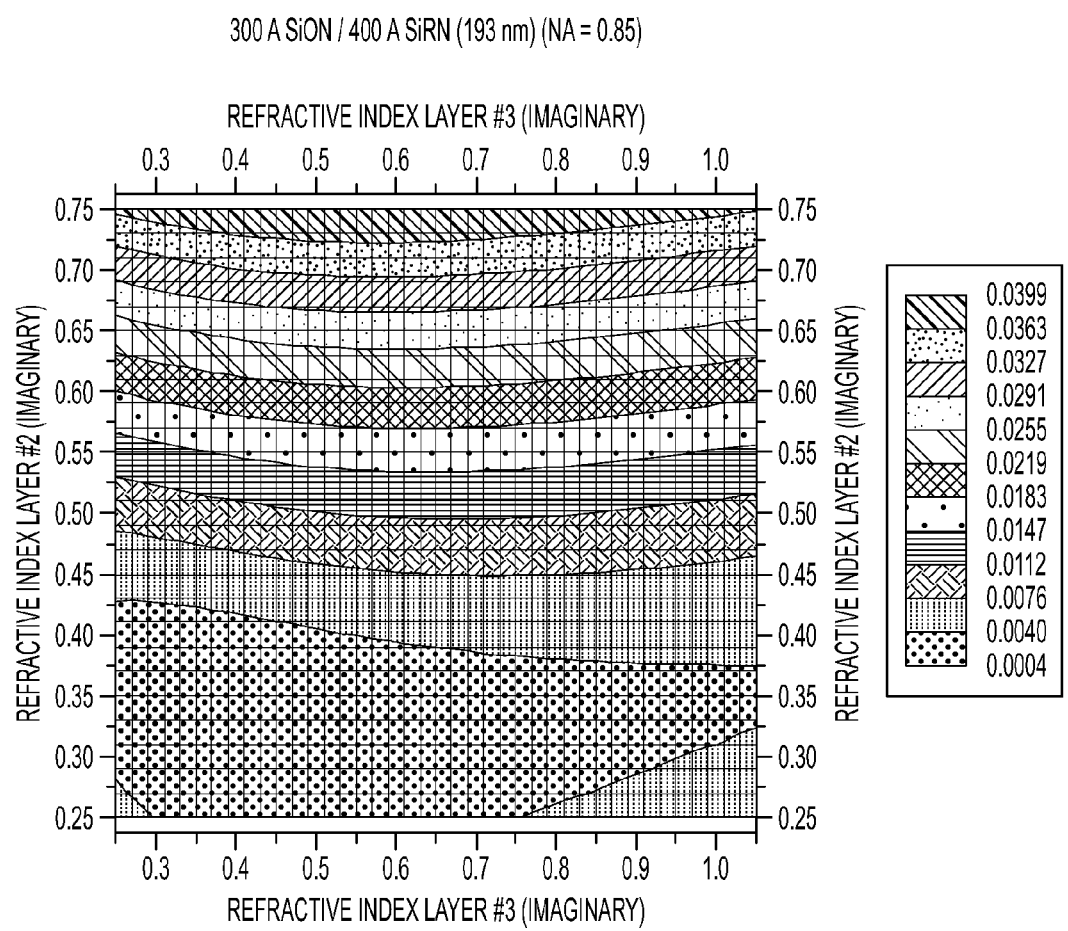
FIG. 11 is a graph showing reflectivity across a spectrum of coefficients of extinction (k) for the bottom and top anti-reflective coating layers.

FIG. 11 shows reflectivity at a numerical aperture set to 0.85. Layer 21 is 300 Å low K SiON (n=1.8, k=0.35). Layer 19 is low K SiRN 400 Å thick layer (n=2.6). Alternatively, layer 19 can be a nitrogen free layer such as SiOC. Reflectivities of below 0.4% are achieved when layers 19 and 21 have an index of refraction of k=0.35.

Figure 12:
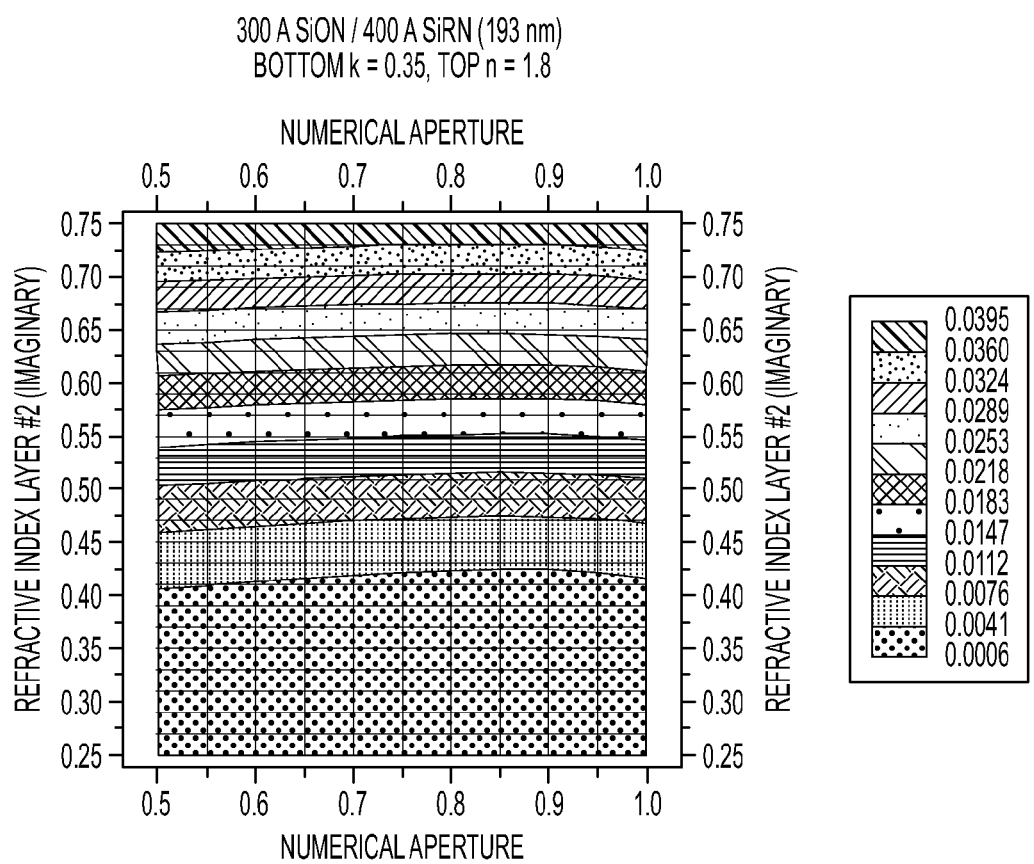
FIG. 12 is a graph showing reflectivity at different numerical apertures and across the spectrum of coefficients of extinction (k) for the top anti-reflective coating.

With reference to FIG. 12, layer 21 is a 300 Å SiON layer and layer 19 is a 400 Å SiRN layer. FIG. 12 shows reflectivity over numerical aperture (NA) range from 0.5 to 1.0 and a refractive index for layer 21 ranging from k 0.25 to 0.75. Layer 21 has n=1.8 and k varies from 0.25-0.75. Layer 19 has a k=0.35 and n=2.664. In FIG. 12, the reflectivity is less than 0.4 percent for all numerical apertures from 0.5 to 1.0 if k=0.35 for layer 21.

Figure 13:
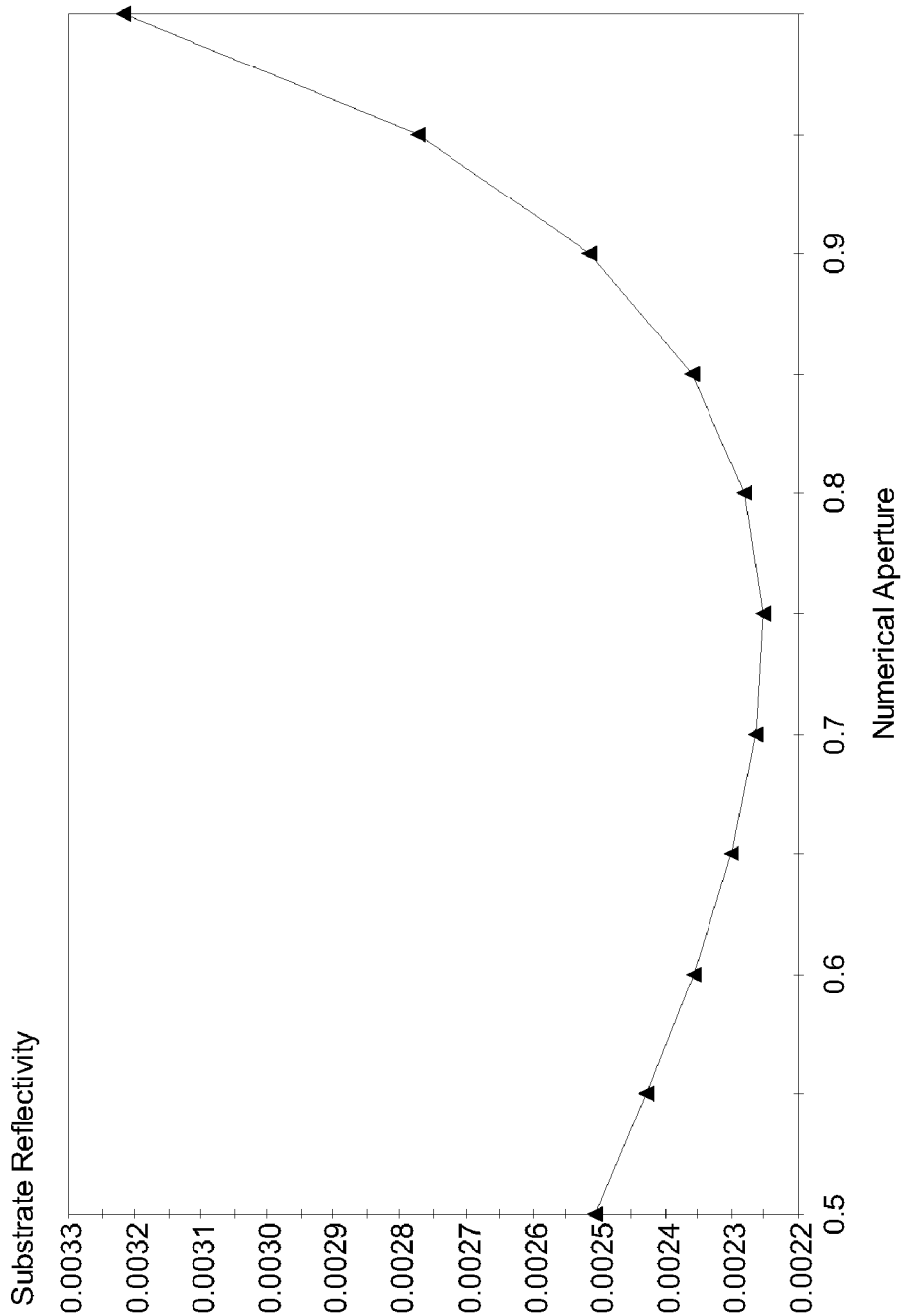
FIG. 13 is a graph showing substrate reflectivity versus numerical aperture where the bottom anti-reflective coating layer has a coefficient of extinction of k=0.35 and the top anti-reflective coating layer has a coefficient of extinction of 0.25.

With reference to FIG. 13, the substrate reflectivity is relatively small across a numerical aperture of 0.5 to 1.0. FIG. 13 utilizes a layer 21 that is 300 Å thick and SiON (k=0.25) and a layer 19 that is 400 Å thick and SiRN (k=0.35). In FIG. 13, reflectivity is below 0.32 percent.

Figure 14:
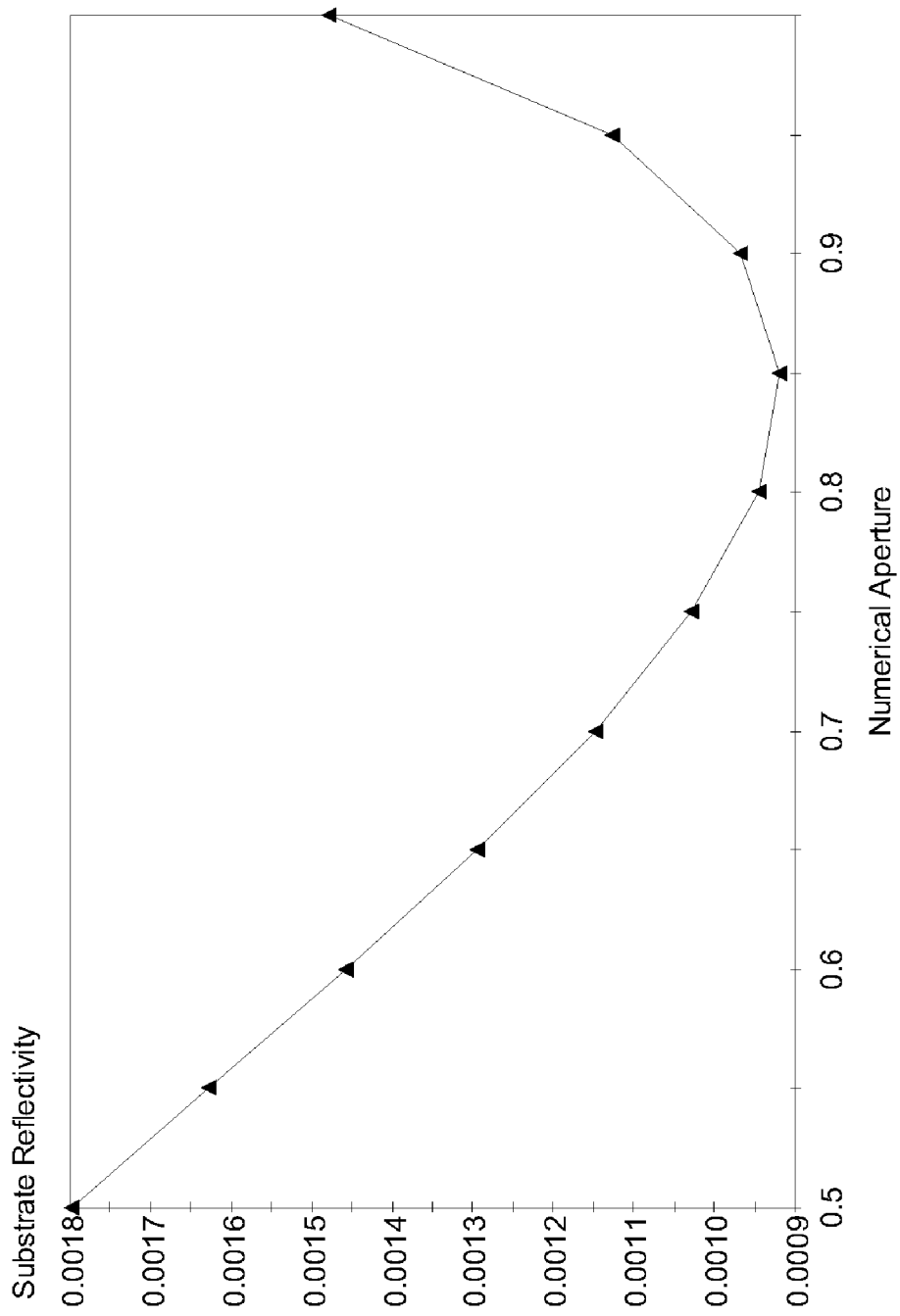
FIG. 14 is a graph showing substrate reflectivity versus numerical aperture where the bottom anti-reflective coating layer has an coefficient of extinction of k=0.35 and the top anti-reflective coating layer has a coefficient of extinction of 0.35.

With reference to FIG. 14, the substrate reflectivity is relatively small across a numerical aperture of 0.5 to 1.0. FIG. 14 utilizes a layer 21 that is 300 Å thick and SiON (k=0.35) and a layer 19 that is 400 Å thick and SiRN (k=0.35). In FIG. 14, reflectivity is below 0.18 percent and a minimum at NA=0.85.

Figure 15:
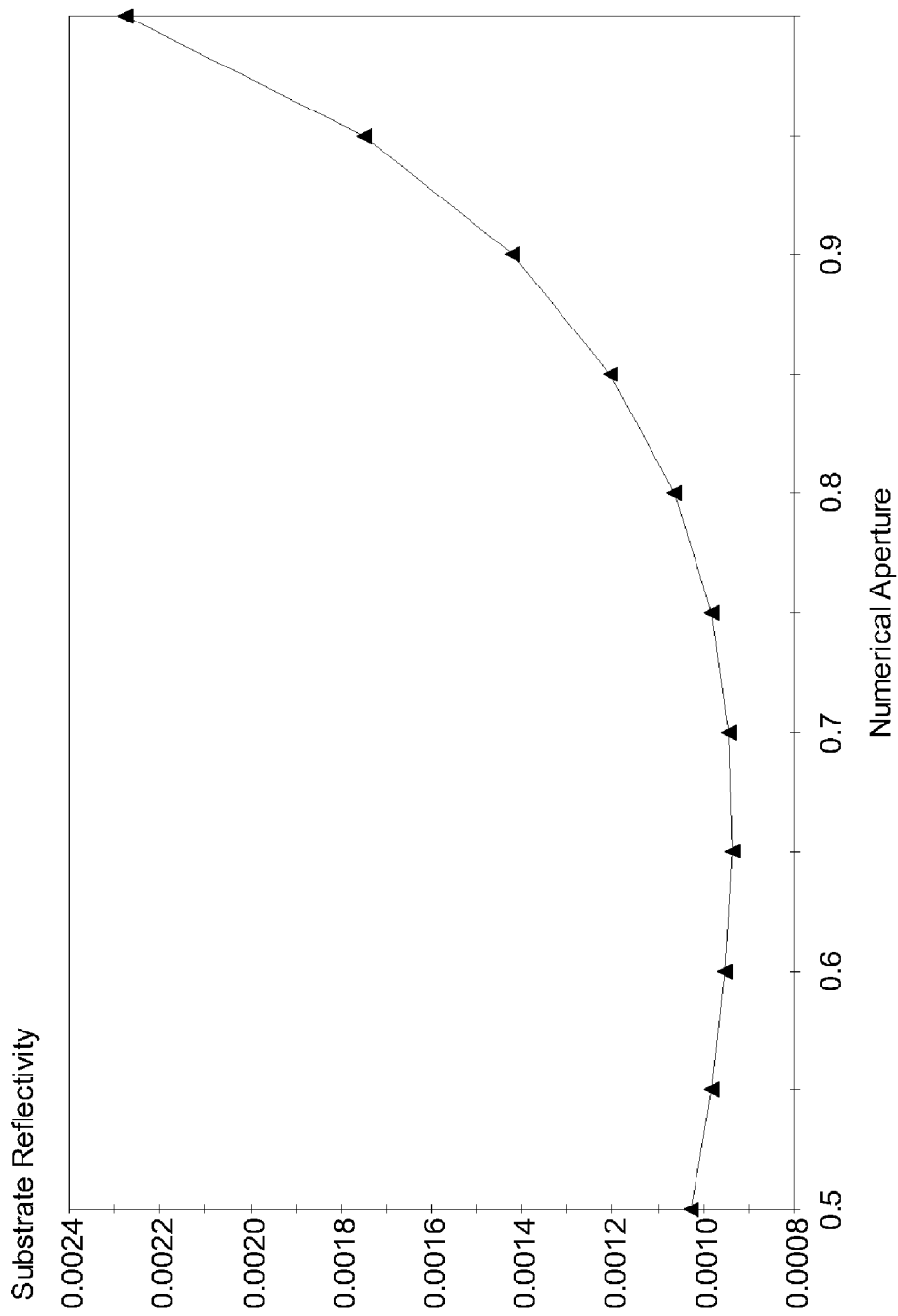
FIG. 15 is a graph showing substrate reflectivity versus numerical aperture where the bottom anti-reflective coating layer has a coefficient of extinction of k=0.35 and the top anti-reflective coating has a coefficient of extinction of k=0.45.

With reference to FIG. 15, the substrate reflectivity is relatively small across a numerical aperture of 0.5 to 1.0. FIG. 15 utilizes a layer 21 that is 300 Å thick and SiON (k=0.45) and a layer 19 that is 400 Å thick and SiRN (k=0.35). In FIG. 15, reflectivity is below 0.23 percent.

Figure 16:
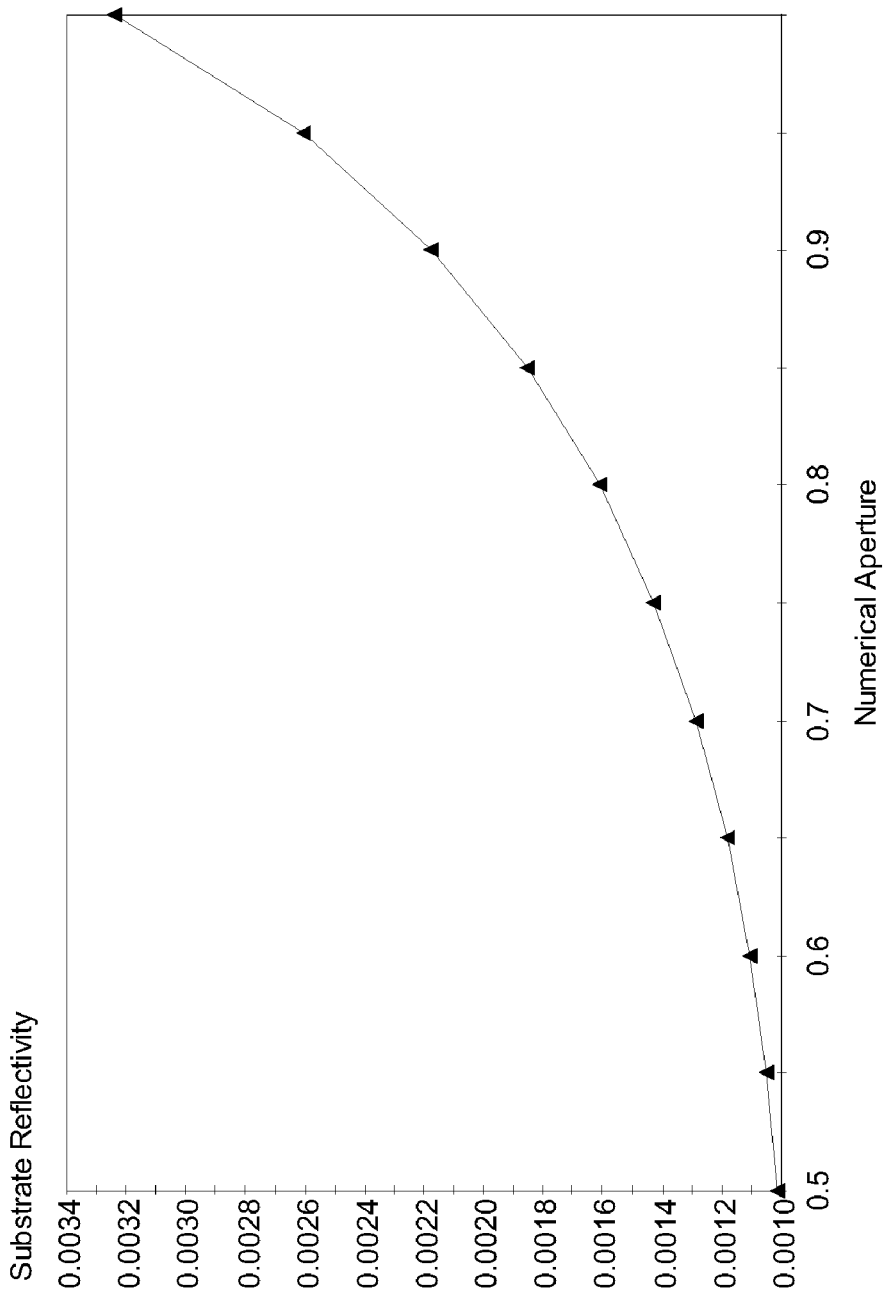
FIG. 16 is a graph showing substrate reflectivity versus numerical aperture where the bottom anti-reflective coating layer has a coefficient of extinction of k=0.35 and the top anti-reflective coating has a coefficient of extinction of k=0.55.

With reference to FIG. 16, the substrate reflectivity is relatively small across a numerical aperture of 0.5 to 1.0. FIG. 16 utilizes a layer 21 that is 300 Å thick (k=0.55) and SiON and a layer 19 that is 400 Å thick and SiRN (k=0.35). In FIG. 16, reflectivity is below 0.33 percent.

FIGS. 13-16 show that reflectivity is optimized with the k value for layer 21 set to 0.35.

Figure 17:
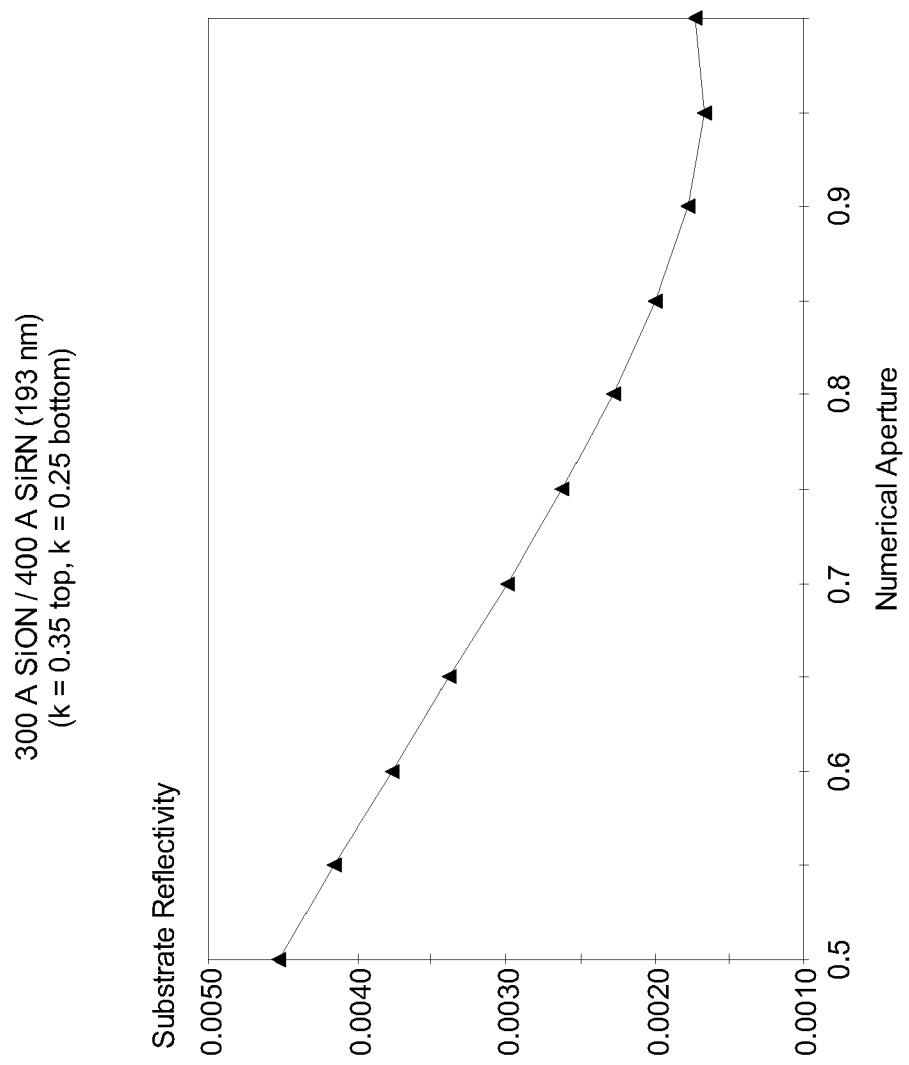
FIG. 17 is a graph showing substrate reflectivity versus numerical aperture where the bottom anti-reflective coating has a coefficient of extinction of k=0.25 and the top anti-reflective coating has a coefficient of extinction of k=0.35.

With reference to FIG. 17, the substrate reflectivity is relatively small across a numerical aperture of 0.5 to 1.0. FIG. 17 utilizes a layer 21 that is 300 Å thick and SiON (k=0.35) and a layer 19 that is 400 Å thick and SiRN (k=0.25). In FIG. 17, reflectivity is below 0.45 percent.

Figure 18:
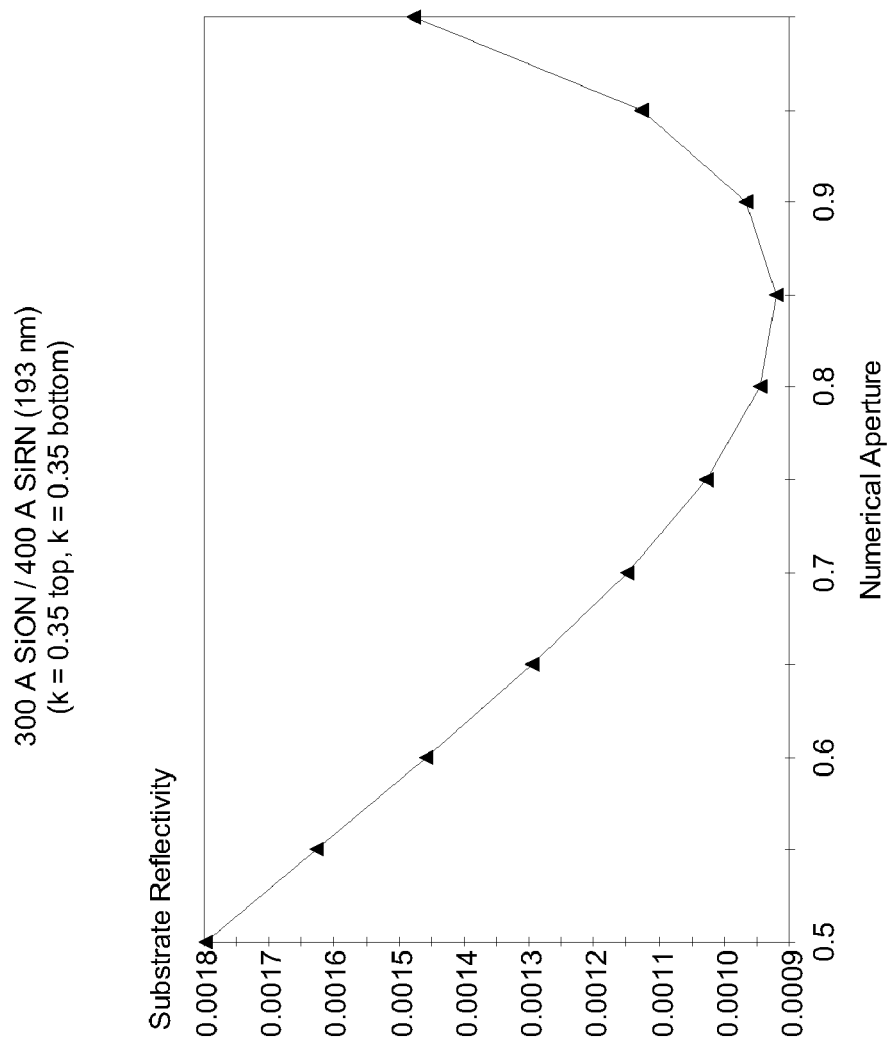
FIG. 18 is a graph showing substrate reflectivity versus numerical aperture where the bottom anti-reflective coating has a coefficient of extinction of k=0.35 and the top anti-reflective coating has a coefficient of extinction of k=0.35.

With reference to FIG. 18, the substrate reflectivity is relatively small across a numerical aperture of 0.5 to 1.0. FIG. 18 utilizes a layer 21 that is 300 Å thick (k=0.35) and SiON and a layer 19 that is 400 Å thick and SiRN (k=0.35). In FIG. 18, reflectivity is below 0.18 percent.

Figure 19:
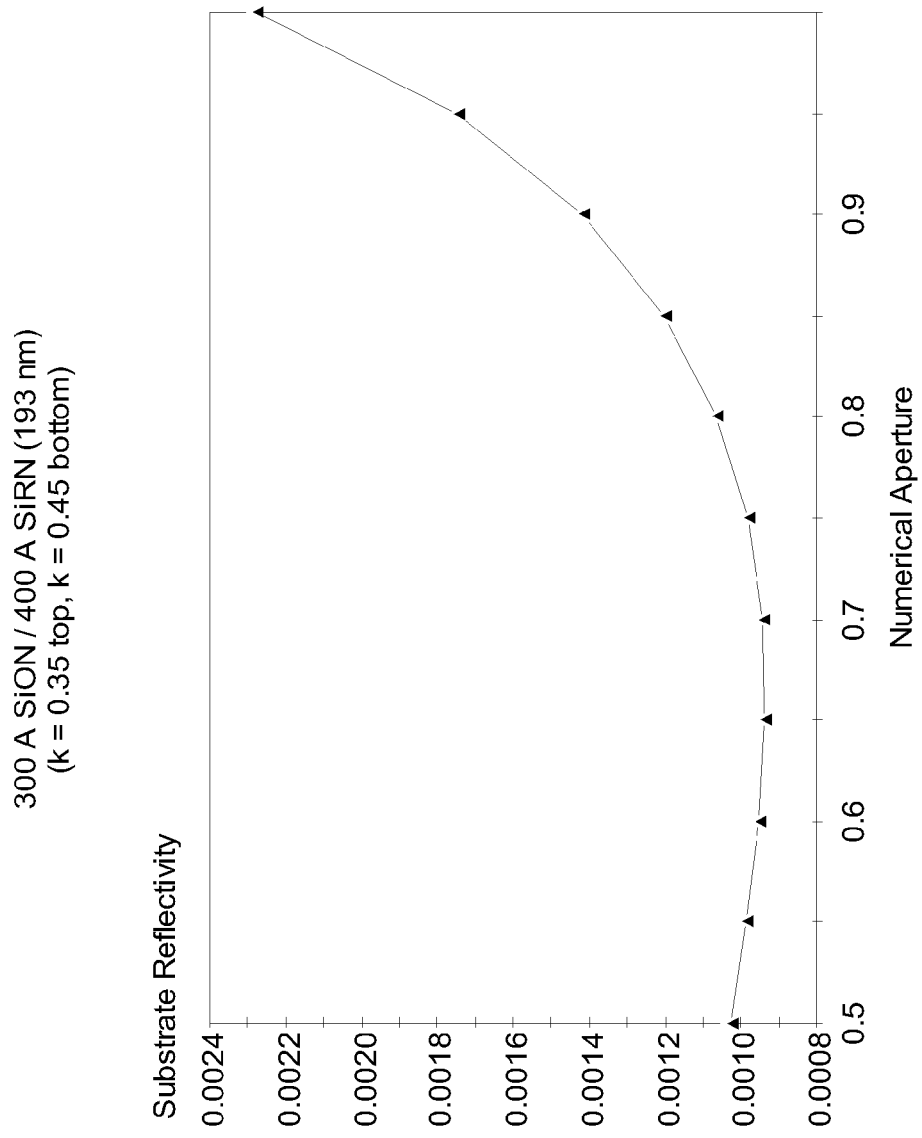
FIG. 19 is a graph showing substrate reflectivity versus numerical aperture where the bottom anti-reflective coating has a coefficient of extinction of k=0.45 and the top anti-reflective coating has a coefficient of extinction of k=0.35.

With reference to FIG. 19, the substrate reflectivity is relatively small across a numerical aperture of 0.5 to 1.0. FIG. 19 utilizes a layer 21 that is 300 Å thick and SiON (k=0.35) and a layer 19 that is 400 Å thick and SiRN (k=0.45). In FIG. 19, reflectivity is below 0.23 percent.

Figure 20:
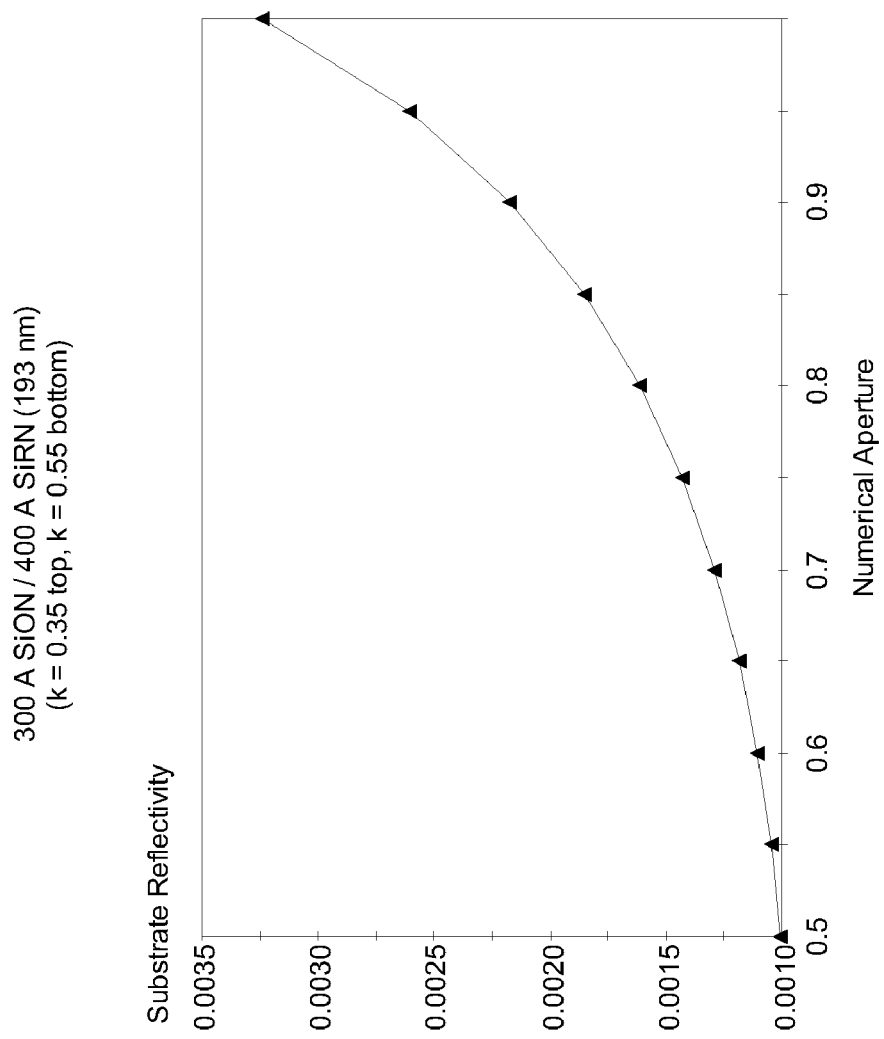
FIG. 20 is a graph showing substrate reflectivity versus numerical aperture where the bottom anti-reflective coating has a coefficient of extinction of k=0.55 and the top anti-reflective coating has a coefficient of extinction of k=0.35.

With reference to FIG. 20, the substrate reflectivity is relatively small across a numerical aperture of 0.5 to 1.0. FIG. 20 utilizes a layer 21 that is 300 Å thick and SiON (k=0.35) and a layer 19 that is 400 Å thick and SiRN (k=0.55). In FIG. 20, reflectivity is below 0.33 percent.

FIGS. 17-20 show that at NA=0.85, layer 16 can be set to a k value of 0.35 to achieve reflectivities of 0 to 0.35% (for f=0.25).

Figure 21:
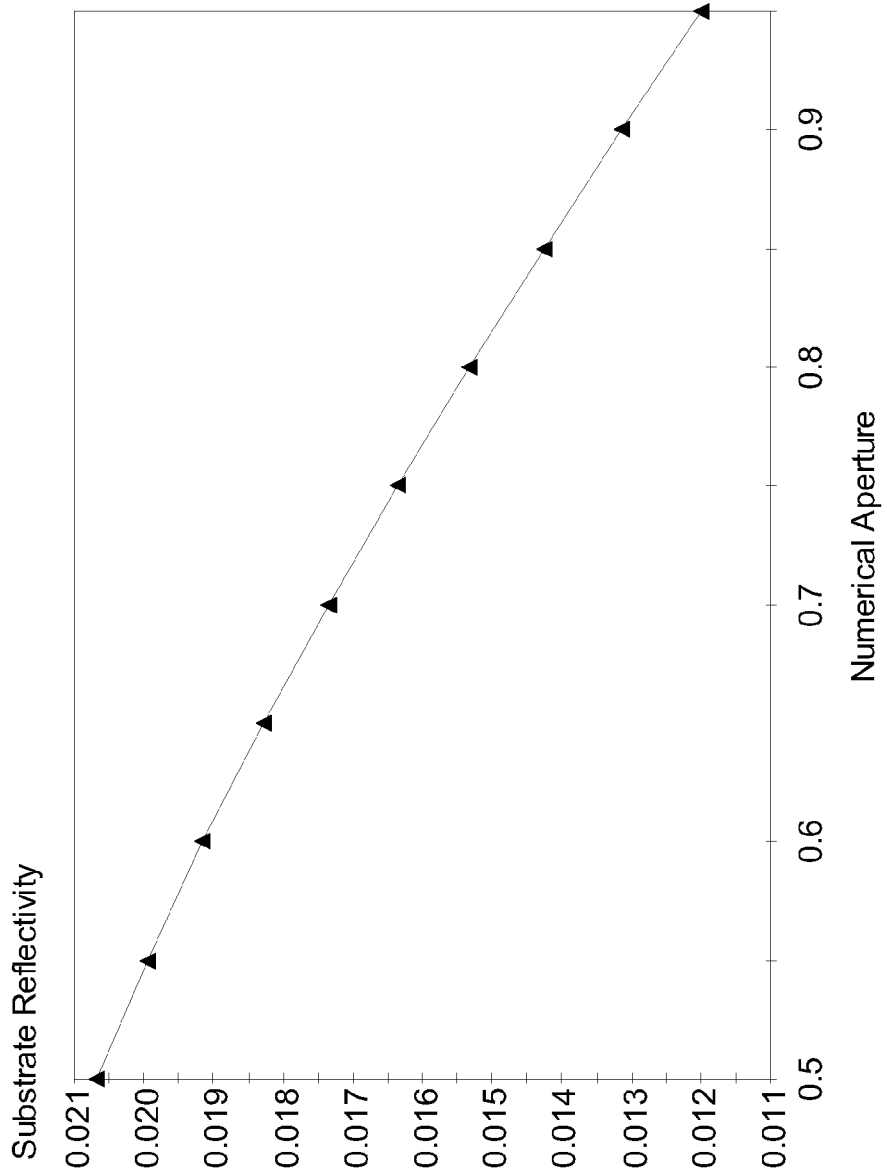
FIG. 21 is a graph showing substrate reflectivity versus numerical aperture with a 100 Å oxide layer over a polysilicon structure where the bottom anti-reflective coating is 400 Å thick.

With reference to FIG. 21, the substrate reflectivity is relatively small across a numerical aperture of 0.5 to 1.0. FIG. 21 utilizes a layer 21 that is 300 Å thick and SiON (n=1.8, k=0.35) and a layer 19 that is 400 Å thick and SiRN (n=2.664, k=0.35). Layer 19 is above a 100 Å silicondioxide layer (e.g. layer 51) over polysilicon (e.g. layer 54). In FIG. 21, reflectivity is below 0.33 percent.

Figure 22:
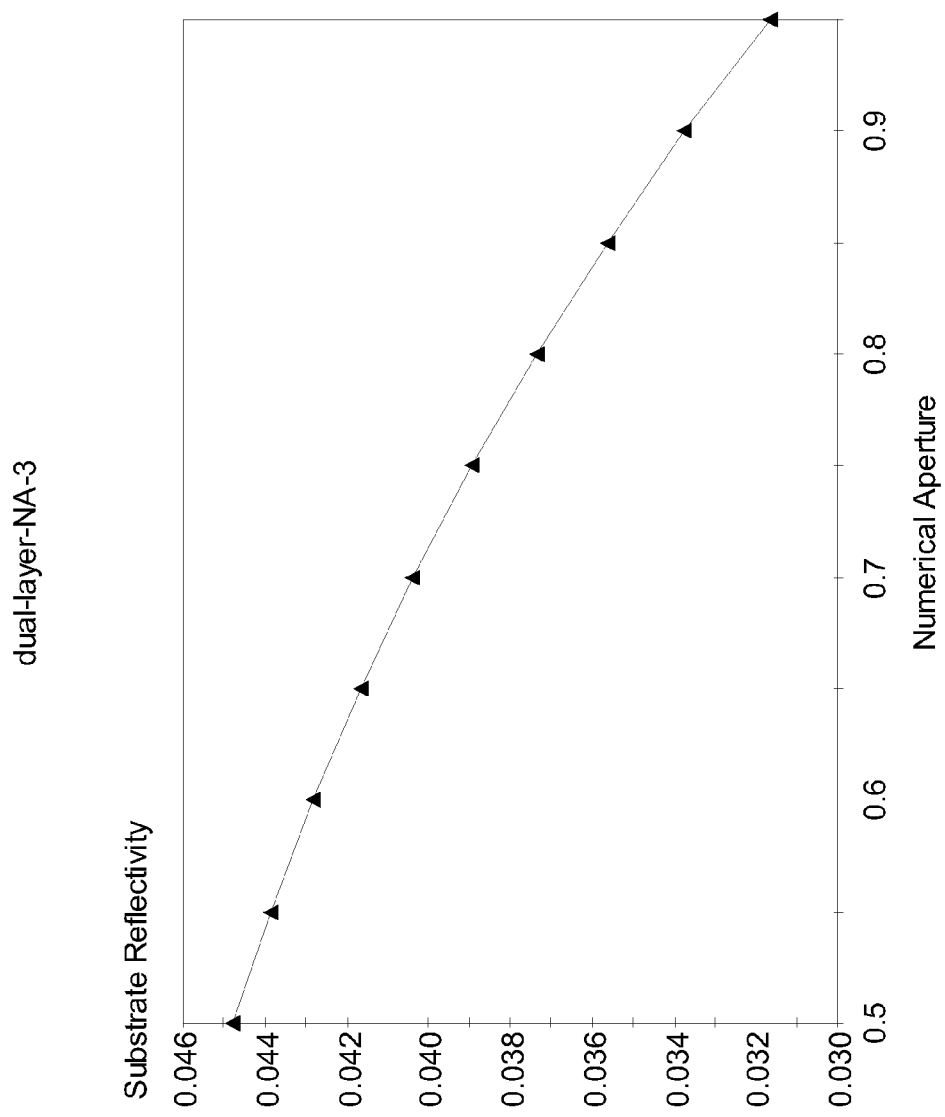
FIG. 22 is a graph showing substrate reflectivity versus numerical aperture with a 200 Å oxide layer over a polysilicon structure where the bottom anti-reflective coating is 300 Å thick.

With reference to FIG. 22, substrate reflectivity is relatively small across a numerical aperture of 0.5-1.0. FIG. 22 utilizes a layer 21 that is 300 Å thick and SiON (n=1.8, k=0.35) and a layer 19 that is 400 Å thick and SiRN (n=2.664, k=0.35). Layer 19 is above a 200 Å thick silicon dioxide layer over polysilicon (e.g., layer 51 over layer 54). FIGS. 21 and 22 show higher reflectivity with the increase in thickness of the silicon dioxide layer (e.g., layer 51).

Figure 23:
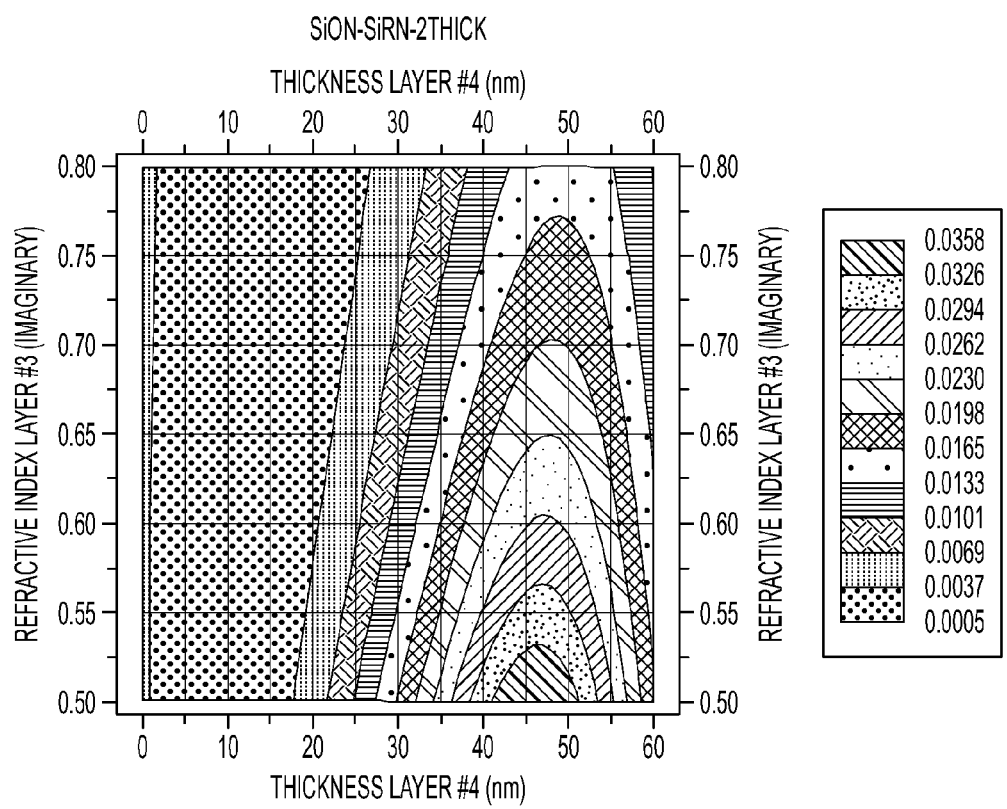
FIG. 23 is a graph showing reflectivity across a spectrum of refractive indices for a 350 Å thick bottom anti-reflective coating and thicknesses for the oxide layer.

With reference to FIG. 23, layer 21 has an n=1.8, k=0.35 and is 300 Å thick of SiON. Layer 19 has the thickness of 350 Å and is SiRN (n=2.664, k=0.8) Layer 51 is from 0 to 60 nanometers thick. Applicants note that high K SiRN films with n=2.65 given here are generally not presently available at 193 nanometers wavelengths. Thicknesses of 100-200 Å for layer 51 result in a 0.2 percent reflectivity.

Figure 24:
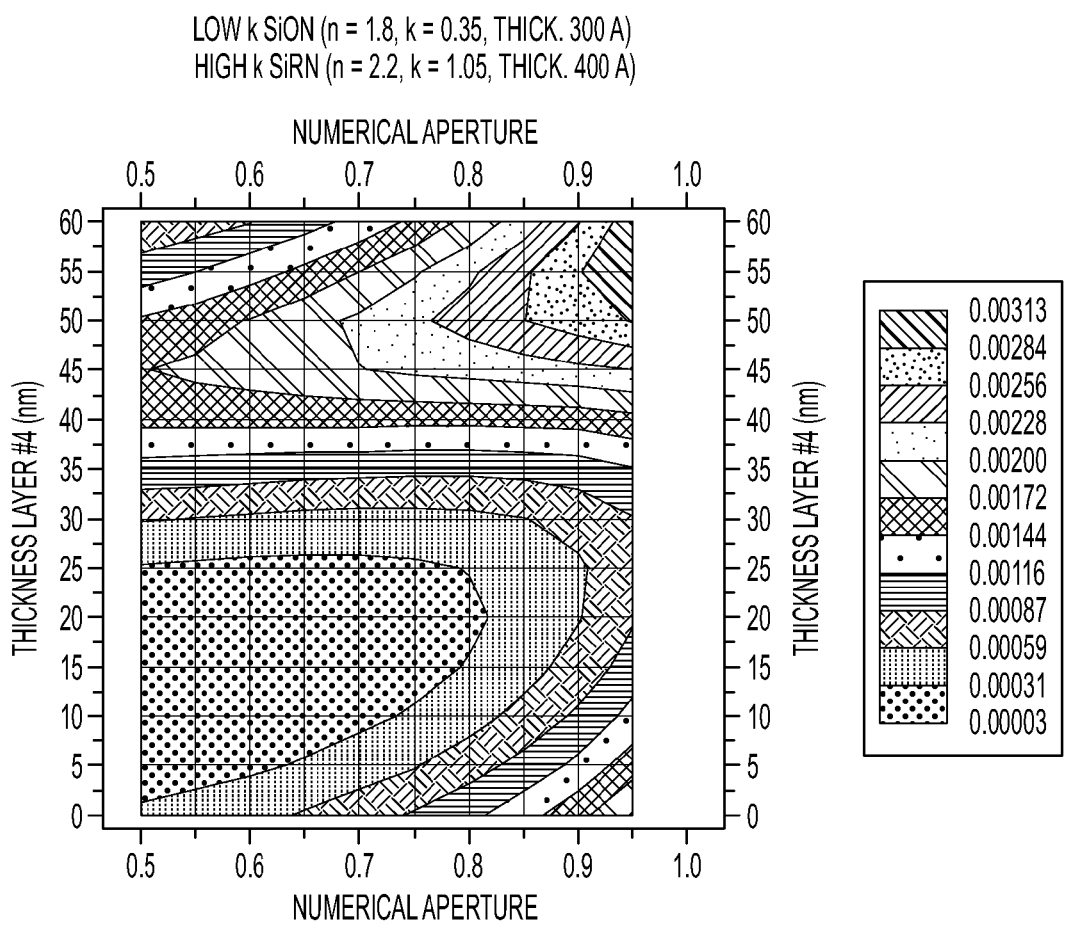
FIG. 24 is a graph showing reflectivities across a spectrum of numerical apertures and thicknesses for the oxide layers where the bottom anti-reflective coating is 400 Å thick and the top anti-reflect layer is 300 Åthick.

With reference to FIG. 24, layer 21 is a 300 Å thick SiON layer having n=1.8 and k=0.35. Layer 19 is a high K SiRN layer having n=2.2, k=1.05, and a thickness of 400 Å. Layer 51 has a thickness from 0 to 60 nanometers and the numerical aperture extends from 0.5 to 1.0. FIG. 24 shows reflectivity is extremely low through numerical apertures for thicknesses of layer 51 from 100 Å to 200 Å and even low at thicknesses of 450 Å.

Figure 25:
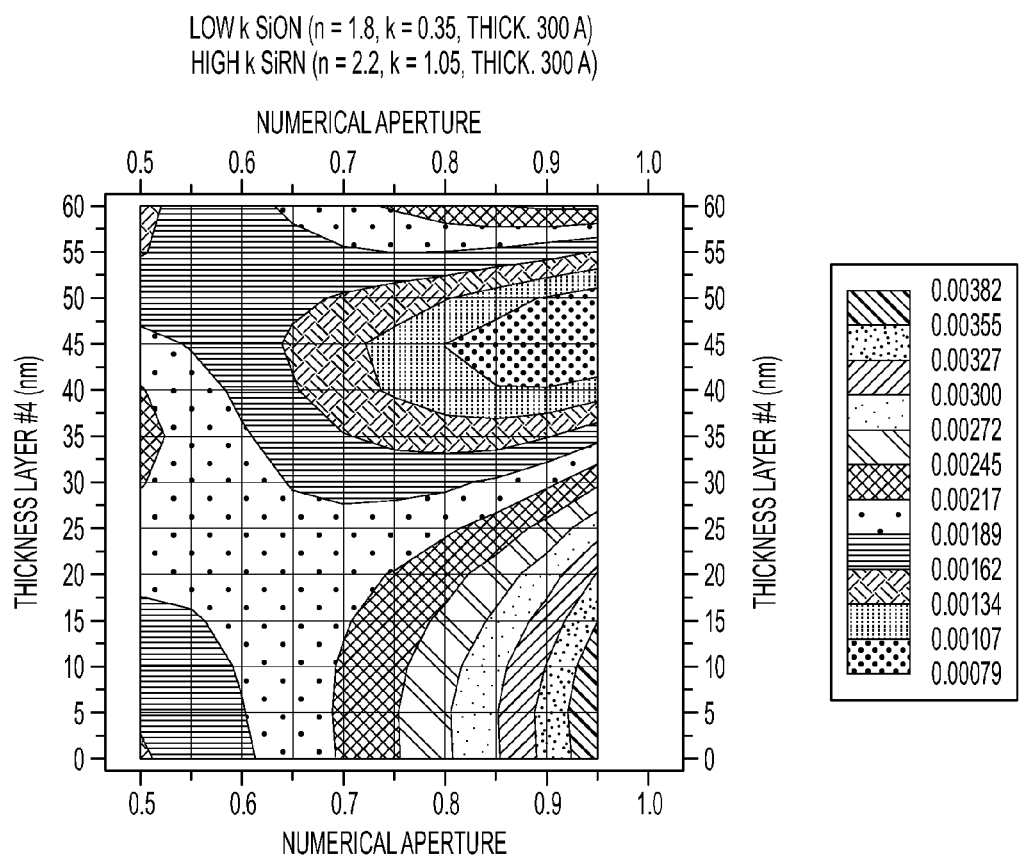
FIG. 25 is a graph showing reflectivities across a spectrum of numerical apertures and thicknesses for the oxide layer where the bottom anti-reflective coating is 300 Å thick.

With reference to FIG. 25, layer 21 is a low K SiON layer having n=1.8, k=0.35, and a thickness of 300 Å. Layer 19 is a high K SiRN layer having N=2.2, K=1.05, and a thickness of 300 Å. The thickness of layer 51 is from 0 to 60 nanometers and the numerical aperture extends from 0.5 to 1.0. FIG. 25 shows reflectivities are extremely low at thicknesses of 450 Å and are low at thicknesses of 100-200 Å for layer 51.

Figure 26:
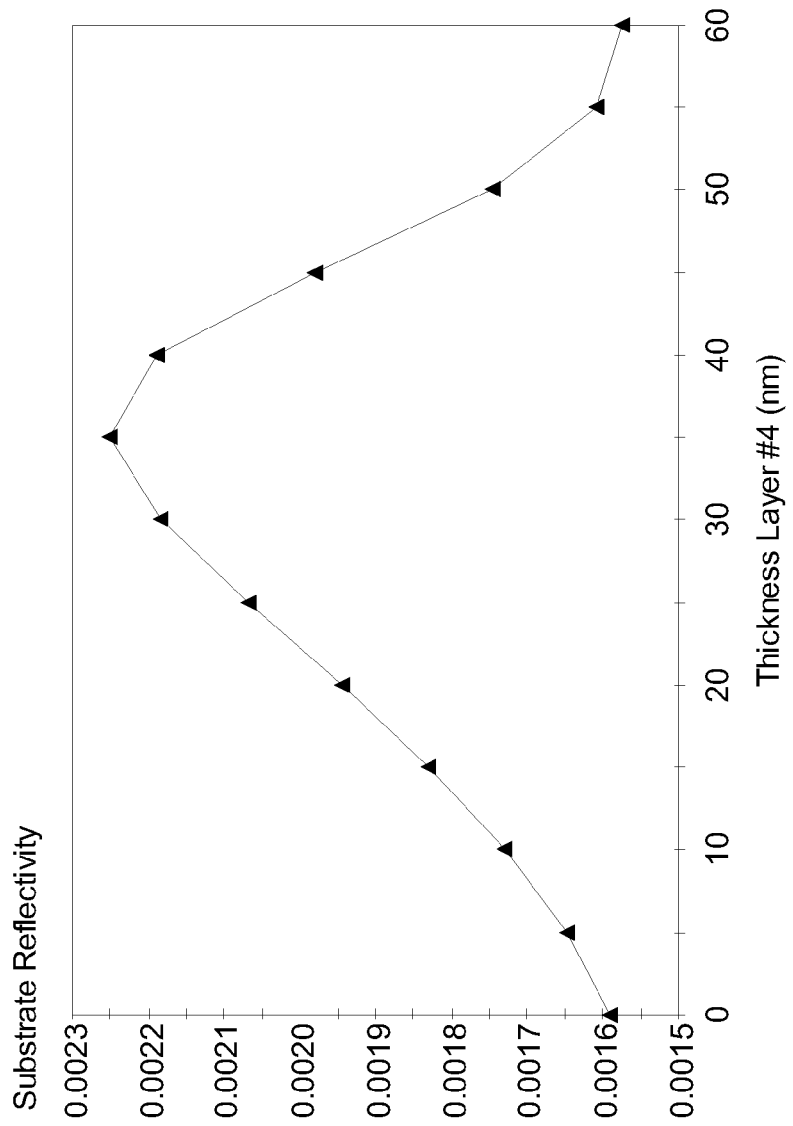
FIG. 26 is a graph showing substrate reflectivity versus the thickness of the oxide layer using a low k SiON/high K SiRN structure.

With reference to FIG. 26, substrate reflectivity versus the thickness of layer 51 is shown. Layer 21 is a low K SiON layer having n=1.8, k=0.35 and a thickness of 300 Å. Layer 19 is a high K SiRN layer having n=2.2, k=1.05, and a thickness of 300 Å. Layer 51 has a thickness from 0 to 60 nanometers and NA=0.85. FIG. 16 shows a reflectivity of below 0.23% for all values of thickness for layer 51.

Figure 27:
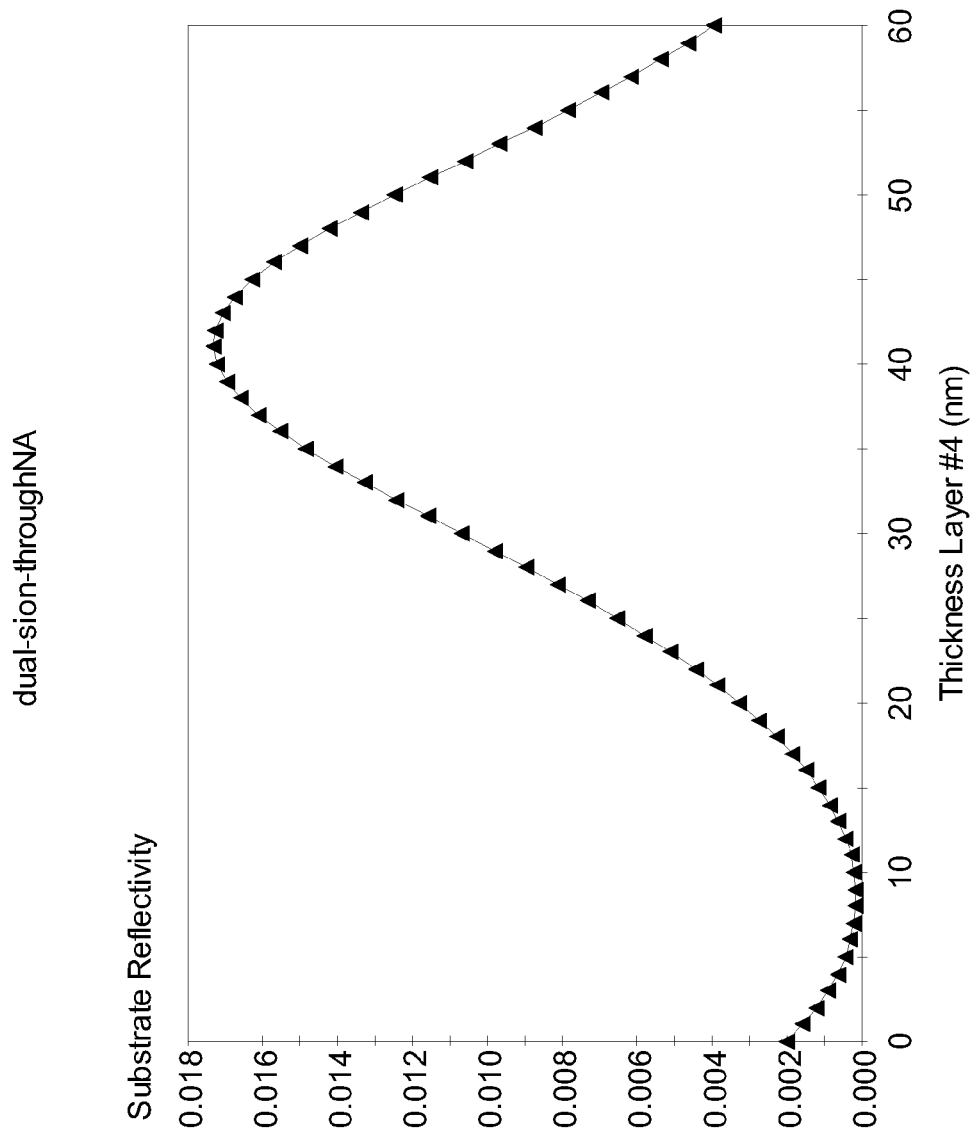
FIG. 27 is a graph showing substrate reflectivity versus the thickness of the oxide layer using a dual SiON anti-reflective coating structure.

With reference to FIG. 27, substrate reflectivity versus the thickness of layer 51 is shown. Layer 19 and 21 are a dual SiON type in which layer 21 is an SiON material, having a thickness of 300 Å (n=1.8, k=0.35). Layer 19 is an SiON layer having a thickness of 350 Å (n=1.9, k=0.65). FIG. 27 shows that the reflectivity is 0.2% or less for 100 Å or less thickness of layer 51. Reflectivity is a minimum between 50 and 100 Å.

Figure 28:
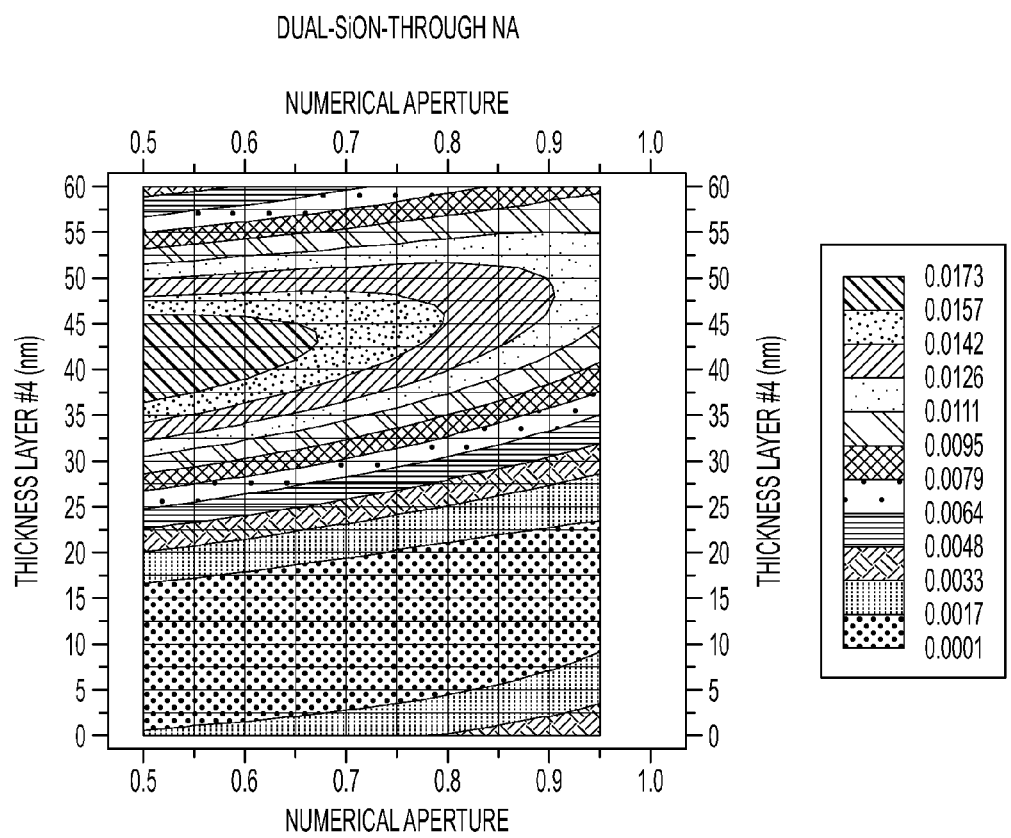
FIG. 28 is a graph showing reflectivity across a spectrum of numerical apertures and thicknesses of the oxide layer for a dual SiON anti-reflective coating structure.

With reference to FIG. 28, reflectivity is shown with respect to numerical apertures and thicknesses for layer 51. Layer 19 is a 400 Å SiON layer (n=1.9, k=0.65). Layer 21 is a 300 Å SiON layer (n=1.8, k=0.35). FIG. 28 shows lower reflectivity for lower HM oxide thicknesses for layer 51. In addition, FIG. 28 appears to show that reflectivities are better with a low K SiON/high K SiRN coating rather than a dual SiON coating in certain circumstances.

Figure 29:
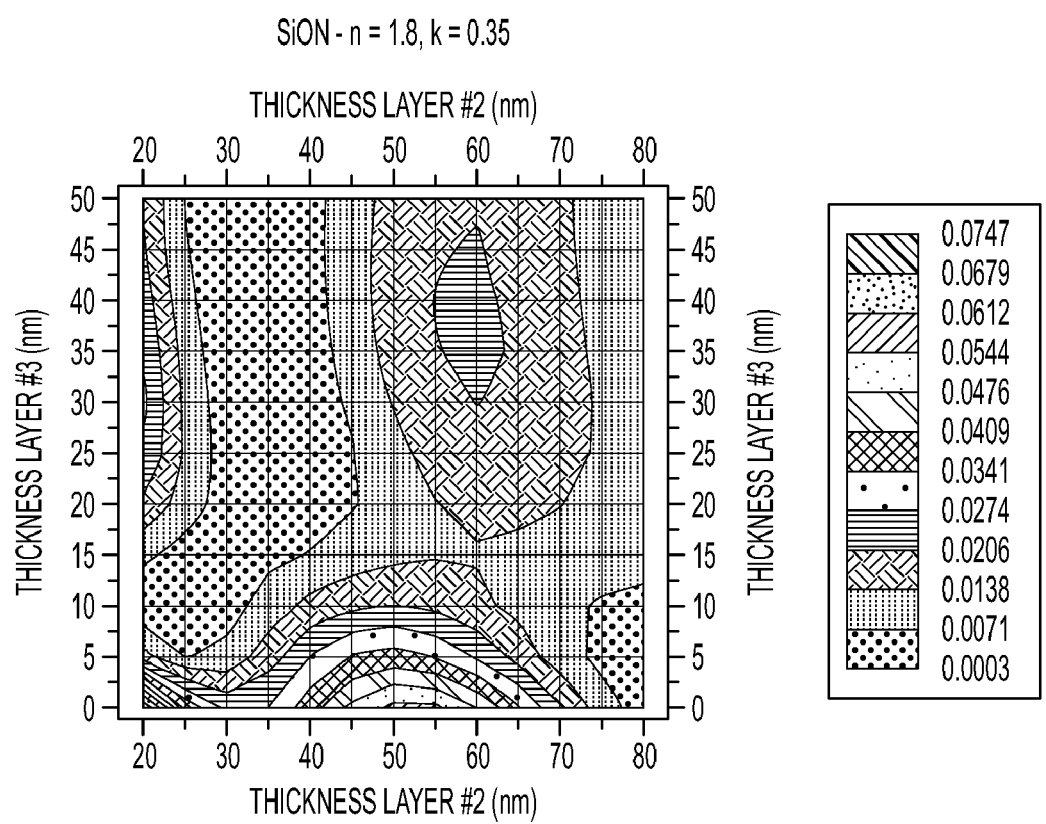
FIG. 29 is a graph showing reflectivity across thicknesses of the top anti-reflective coating and the bottom anti-reflective coating where the top layer is an SiON layer with k=0.35 and n=1.8.

With reference to FIG. 29, reflectivity is shown with respect to the thickness of layers 19 and 21. Layer 19 is SiRN as n=2.2 and k=1.05. Layer 21 is an SiON layer having n=1.8 and k=0.35.

Figure 30:
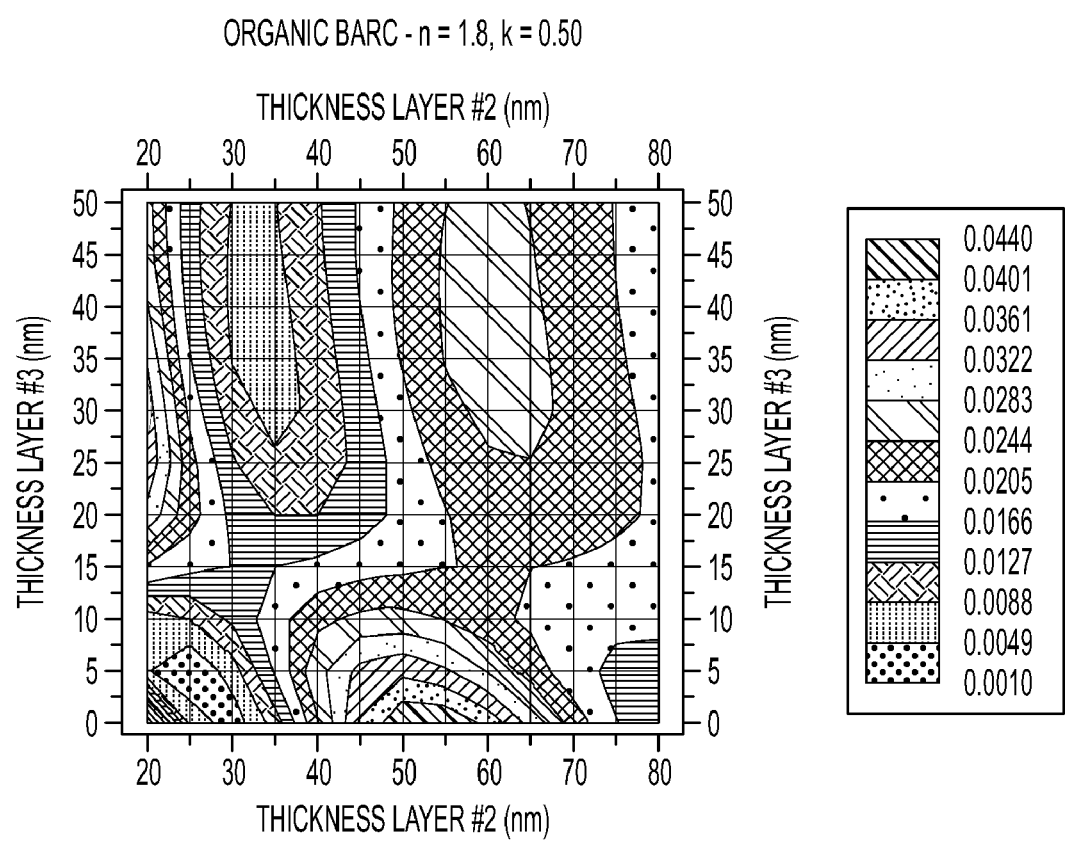
FIG. 30 is a graph showing reflectivity across a spectrum of thickness of the top anti-reflective coating and the bottom anti-reflective coating where the top layer is an organic BARC layer with k=0.50 and n=1.8.

With reference to FIG. 30, reflectivity is shown with respect to thicknesses of layers 19 and 21 where a structure is similar to that discussed with respect to FIG. 29. However, layer 21 has an index of refraction with k=0.5.

Figure 31:
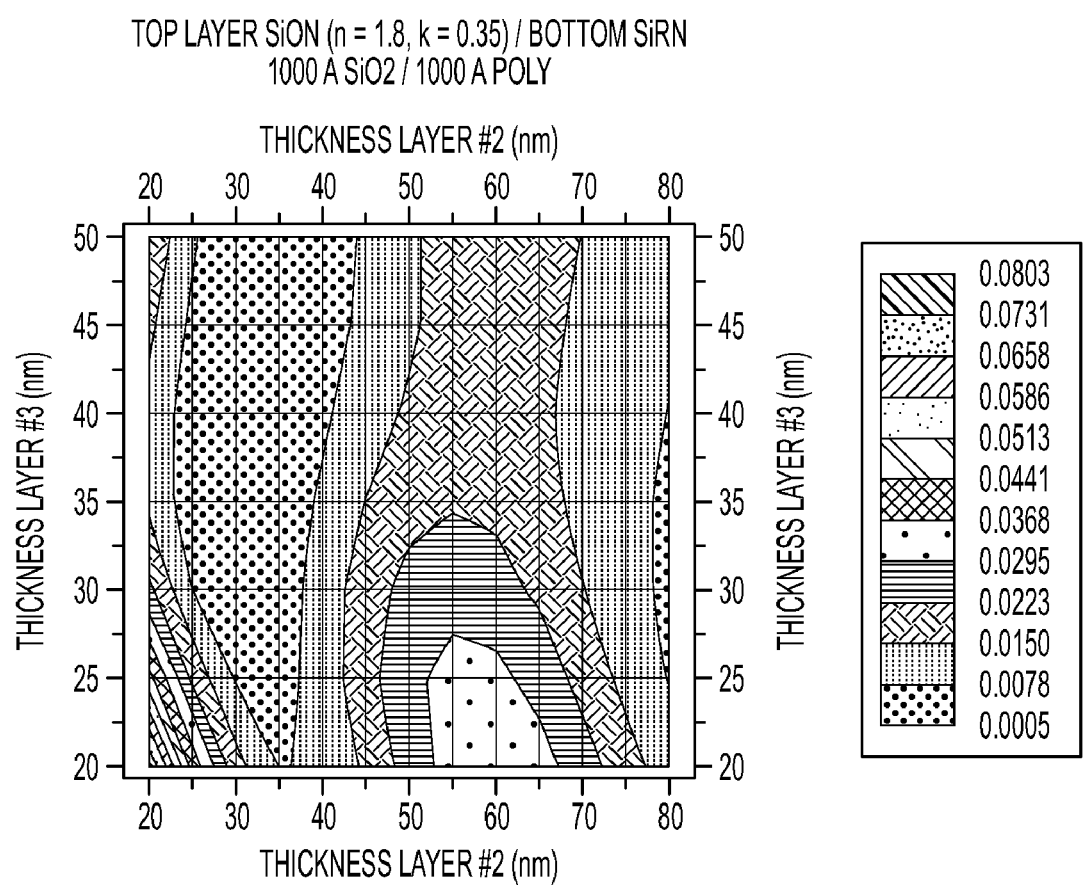
FIG. 31 is a graph showing reflectivity across a spectrum of thickness of the top anti-reflective coating and the bottom anti-reflective coating where the top layer is SiON (n=1.8, k=0.35) and the bottom layer is above a 1000 Å oxide layer.

With reference to FIG. 31, reflectivity is shown with respect to thicknesses of layers 19 and 21 where a structure is similar to the structure of FIG. 29. However, layer 219 is provided above a 1000 Å silicon dioxide layer which is above a 1000 Å polysilicon layer (e.g., layer 51 over layer 54).

Figure 32:
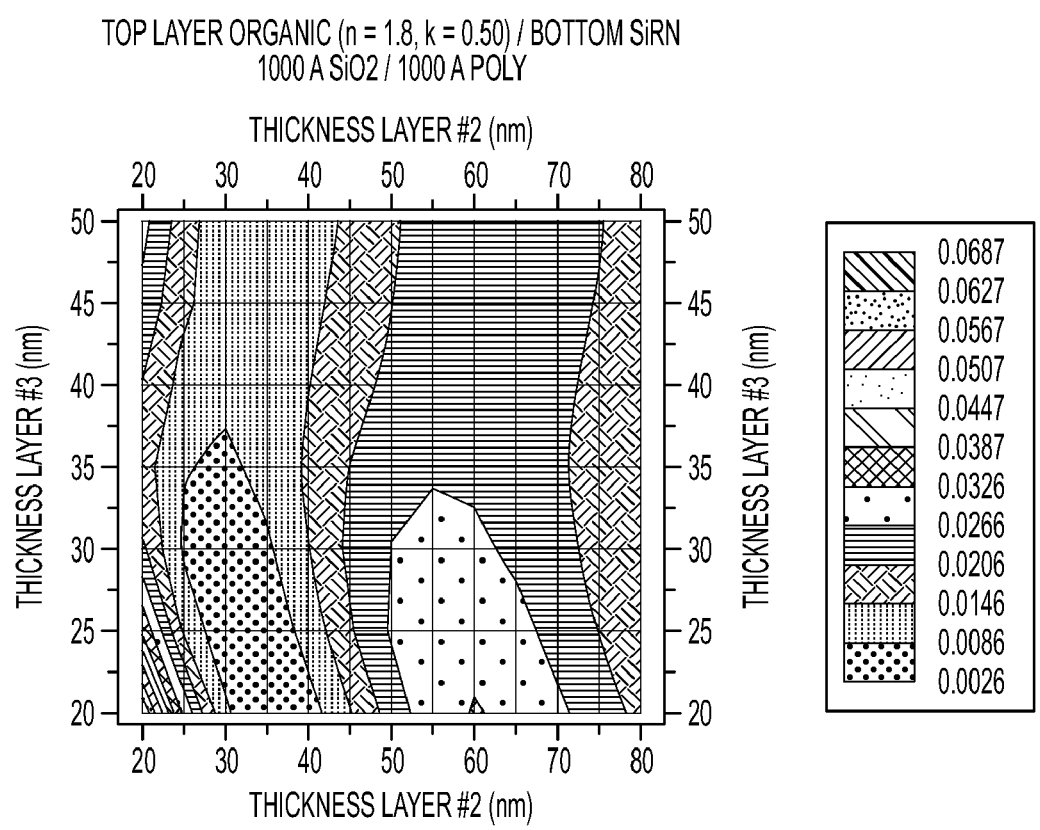
FIG. 32 is a graph showing reflectivity across a spectrum of thickness of the top anti-reflective coating and the bottom anti-reflective coating where the bottom layer is above a 1000 Å thick oxide layer and the top layer is SiON (n=1.8, k=0.5)

With reference to FIG. 32, reflectivity is shown with respect to thicknesses of layers 19 and 21. The structure utilized in FIG. 32 is similar to the structure of FIG. 31; however, layer 19 has a k value equal to 0.50.

Figure 33:
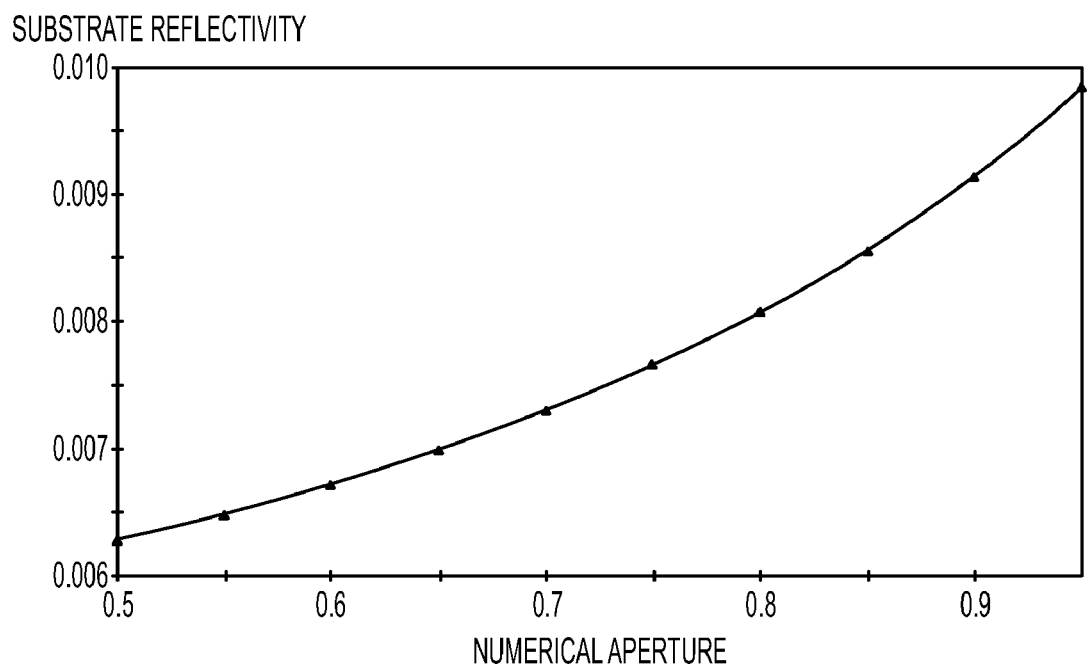
FIG. 33 is a graph showing substrate reflectivity versus numerical aperture for a dual BARC spin-on structure above a 1000 Å polysilicon layer.

With reference to FIG. 33, substrate reflectivity versus numerical aperture is shown. Layers 19 and 21 are dual bottom anti-reflective coatings (BARCs). Layer 21 is spun on as a 300 Å BARC layer above a 350 Å bottom BARC layer above a 1000 Å polysilicon layer.

Figure 34:
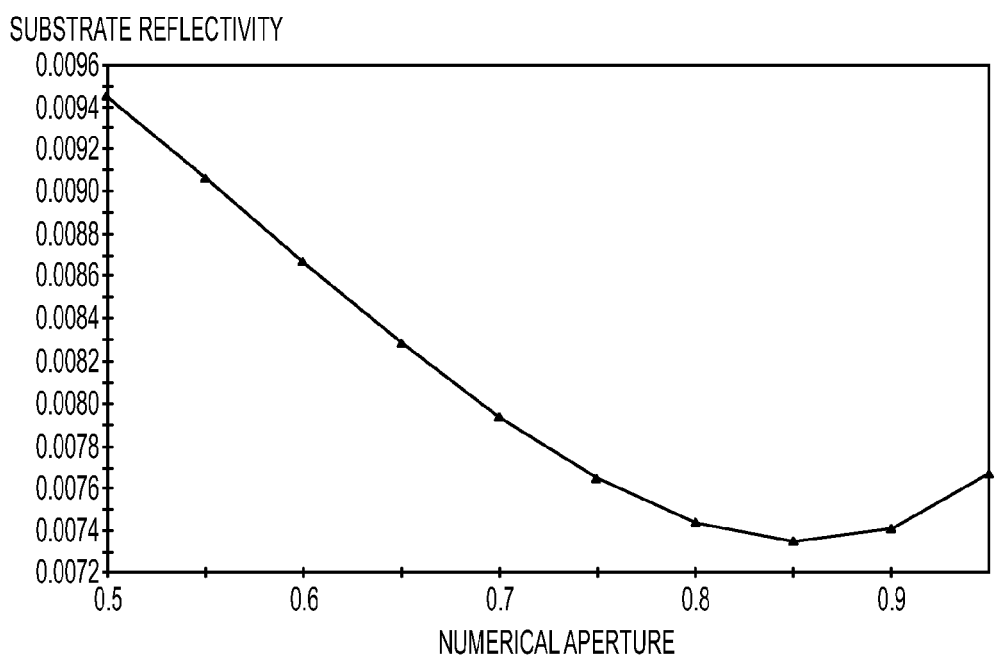
FIG. 34 is a graph showing substrate reflectivity versus numerical aperture for a dual BARC spin-on structure above a 1000 Å SiON layer.

With reference to FIG. 34, reflectivity is shown with respect to numerical aperture for a structure similar to the structure of FIG. 33; however, layer 19 is provided above a 1000 Å SiON layer which is above a 1000 Å polysilicon layer.

Figure 35:
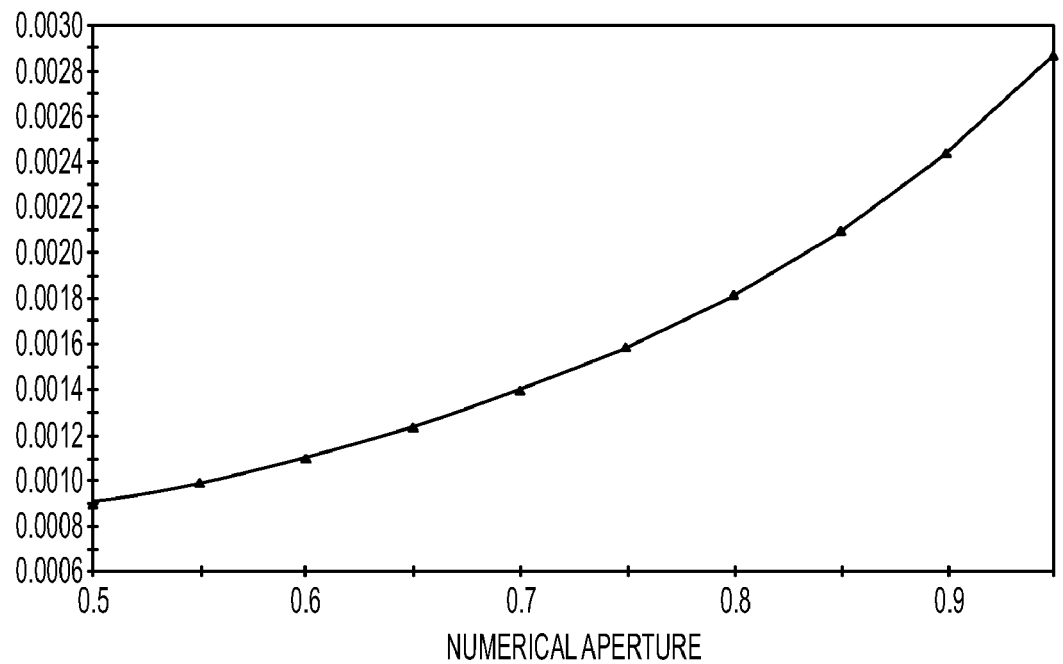
FIG. 35 is a graph showing substrate reflectivity versus numerical aperture for an inorganic dual BARC spin-on structure above a 1000 Å polysilicon layer.

With reference to FIG. 35, reflectivity is shown with respect to numerical apertures for a structure similar to the structure of FIG. 33; however, layers 19 and 21 are inorganic BARC layers.

Figure 36:
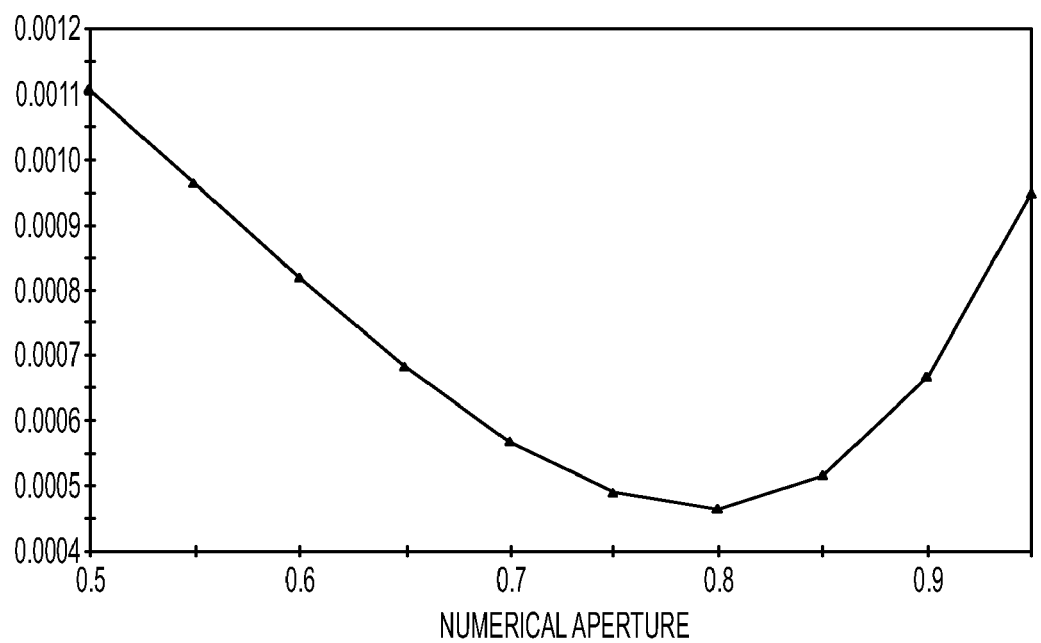
FIG. 36 is a graph showing substrate reflectivity versus numerical aperture for an inorganic dual BARC structure above a 1000 ÅSiON layer.

With reference to FIG. 36, reflectivity is shown with respect to numerical apertures. FIG. 36 utilizes structures similar to FIG. 35; however, layers 19 and 21 are provided above a 1000 Å SiON layer which is above a 1000 Å polysilicon layer.

Figure 37:
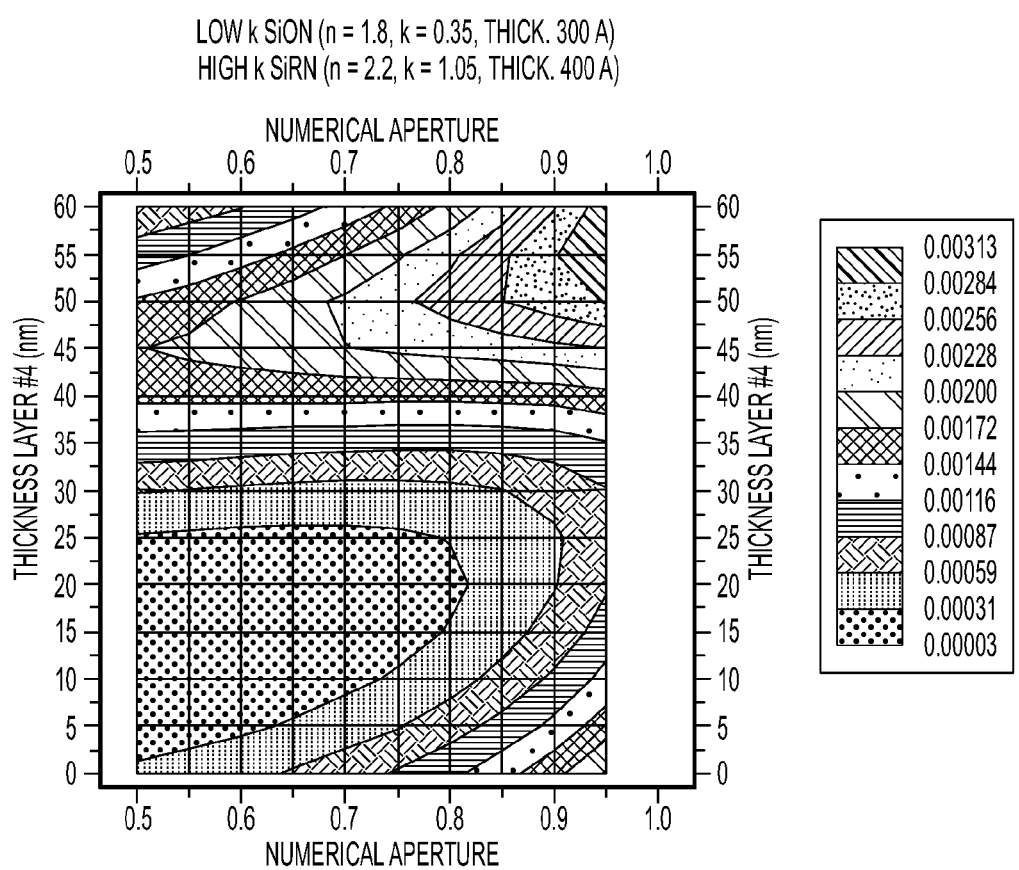
FIG. 37 is a graph showing reflectivity versus a spectrum of numerical apertures and thickness for the oxide layer where the bottom anti-reflective coating is 400 Å thick.

With reference to FIG. 37, layer 21 is a low K SiON layer (n=1.8, k=0.35, and thickness=300 Å and layer 21 is a high K SiRN layer (n=2.2, k=1.05, thickness=400 Å). The numerical aperture is adjusted from 0.5 to 1.0 and the thickness of layer 51 ranges from 0 to 600 nanometers. FIG. 37 shows that the reflectivity is extremely low across numerical apertures when layer has a thickness of 100-200 Å. Reflectivity is low at thicknesses of 450 Å.

Figure 38:
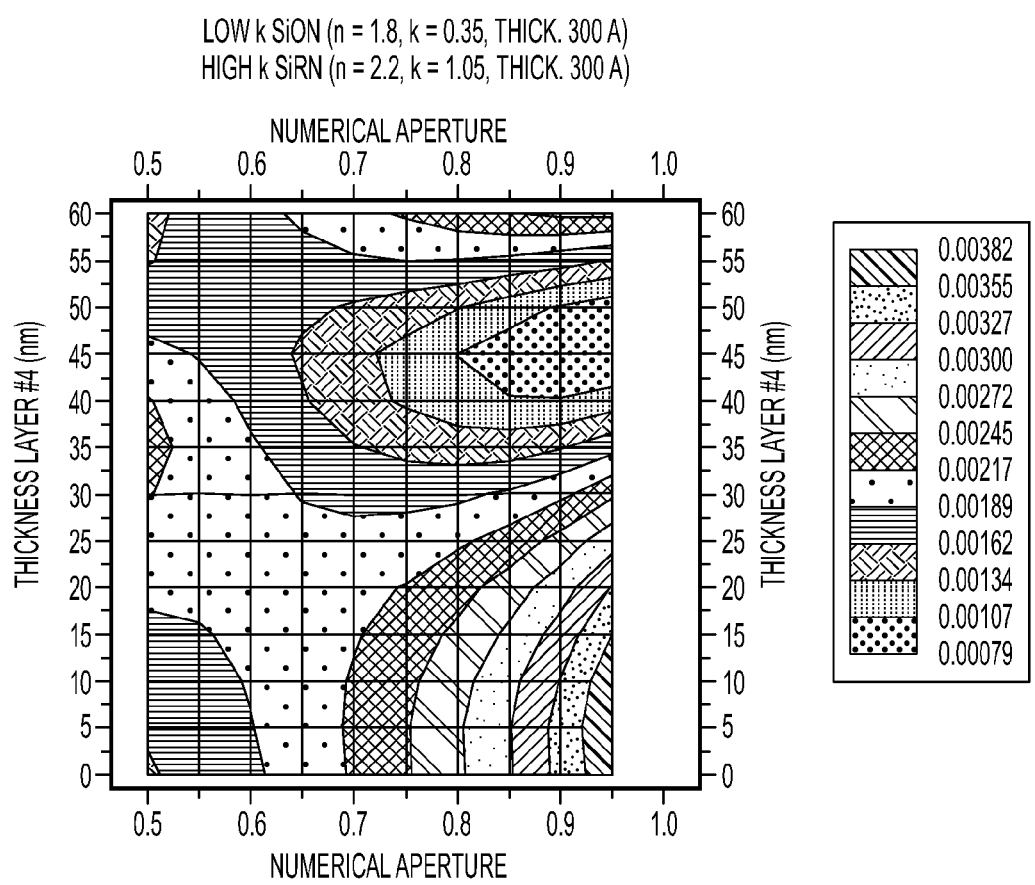
FIG. 38 is a graph showing reflectivity versus a spectrum of numerical apertures and thickness of the oxide layer where the bottom anti-reflective coating is 300 Å thick.

With reference to FIG. 38, layers 19 and 21 are a dual BARC combination. Layer 21 is a low K SiON layer (n=1.8, k=0.35, thickness=300 Å and layer 19 is a high K SiRN layer (n=2.2, k=1.05, and thickness=300 Å). The numerical aperture is adjusted from 0.5 to 1.0 and the thickness of layer 51 is between 0 and 600 Å. FIG. 37 shows reflectivity is extremely low at thicknesses of 450 Å for numerical apertures is 0.5 to 1.0 and remains low at thicknesses of 100-200 Å.

Figure 39:
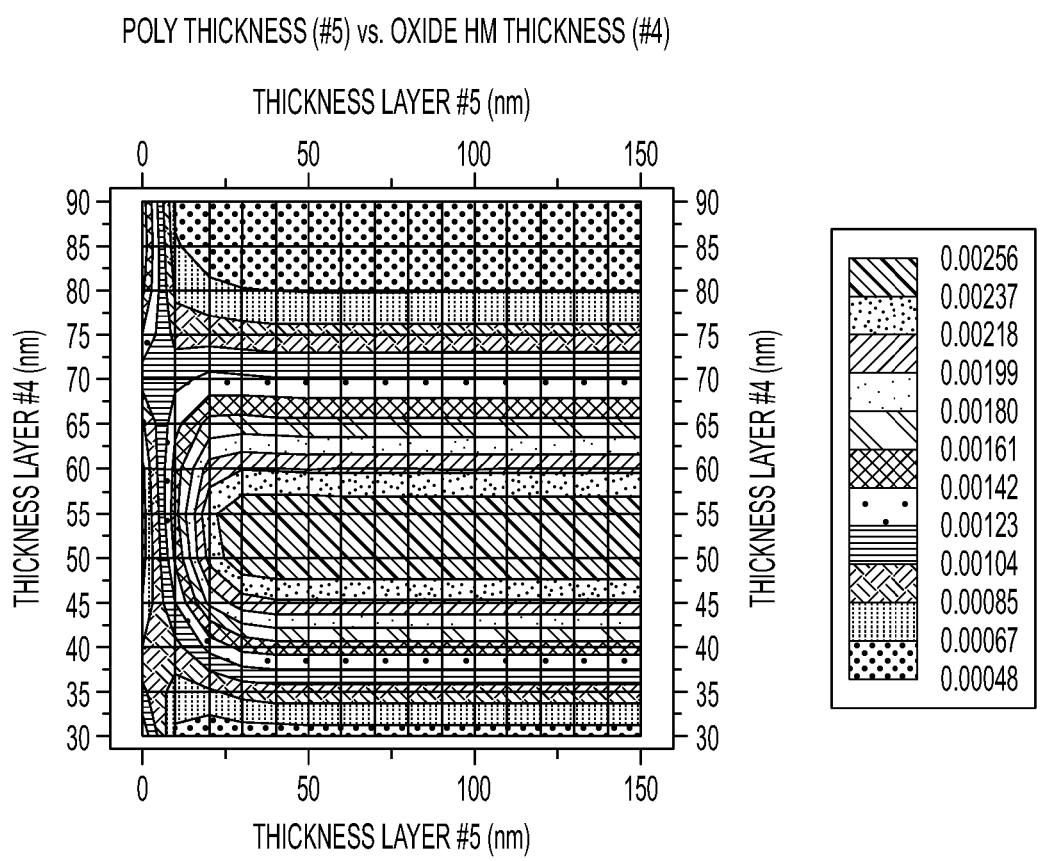
FIG. 39 is a graph showing reflectivity across a spectrum thickness of the oxide layer and the polysilicon layer.
Figure 40:
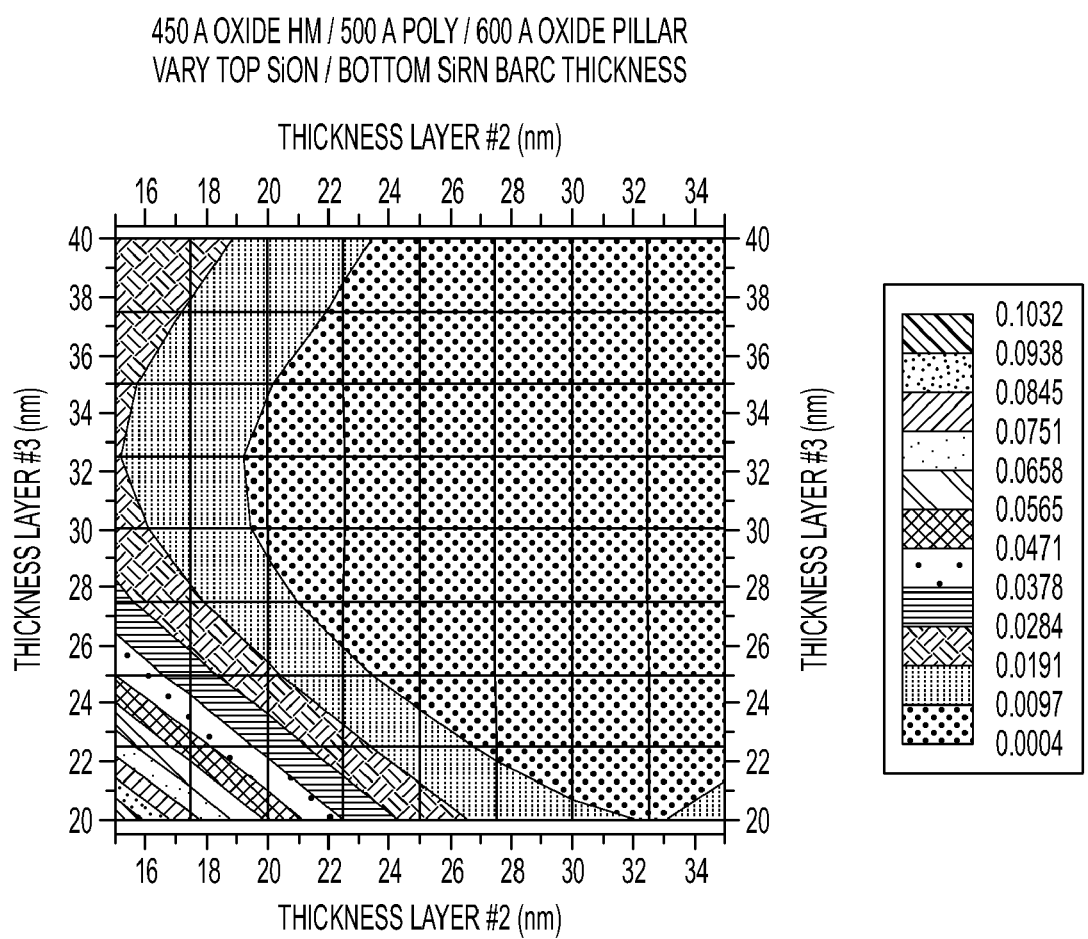
FIG. 40 is a graph showing reflectivity across a spectrum of thicknesses of the top anti-reflective coating and the bottom anti-reflective coating above a 450 Å thick oxide layer.

With reference to FIG. 39, structure 14 includes a 300 Å SiON layer 21 and a 400 Å SiRN layer 19. Reflectivity is as shown across the spectrum of thicknesses for layer 51 and layer 52. Thickness of layer 52 ranges from 0 to 150 nanometers and thickness for layer 51 ranges from 30-90 nanometers. Numerical aperture is fixed at 0.85. FIG. 39 shows contours for reflectivity are flat about a 500 Å minimum thickness for layer 52. Thickness of layer 52 can range between 500 and 1500 Å below layer 51, which is oxide HM. Oxide depth beneath a minimum thickness of 500 Å of polysilicon does not change reflectivity With reference to FIG. 40, reflectivity with respect to the thicknesses of layers 21 and 19 is shown. Layer 51 is a 450 Å oxide HM layer and layer 52 is a 500 Å poly silicon layer above a 600 Å oxide layer. With reference to FIG. 40, reflectivity is shown with respect to the thickness of layers 19 and 21. Layers 19 and 21 are above a 450 Å oxide HM layer 51 above a 500 Å poly silicon layer 54 above a 600 Å oxide layer.

Layer 21 is a thickness of 16 nanometers to 34 nanometers and layer 19 has a thickness from 20 nanometers to 40 nanometers. Reflectivities are lowest or thickness of a 250 Å layer 21 and a 300 Å layer 19. The numerical aperture is 0.85.

Figure 41:
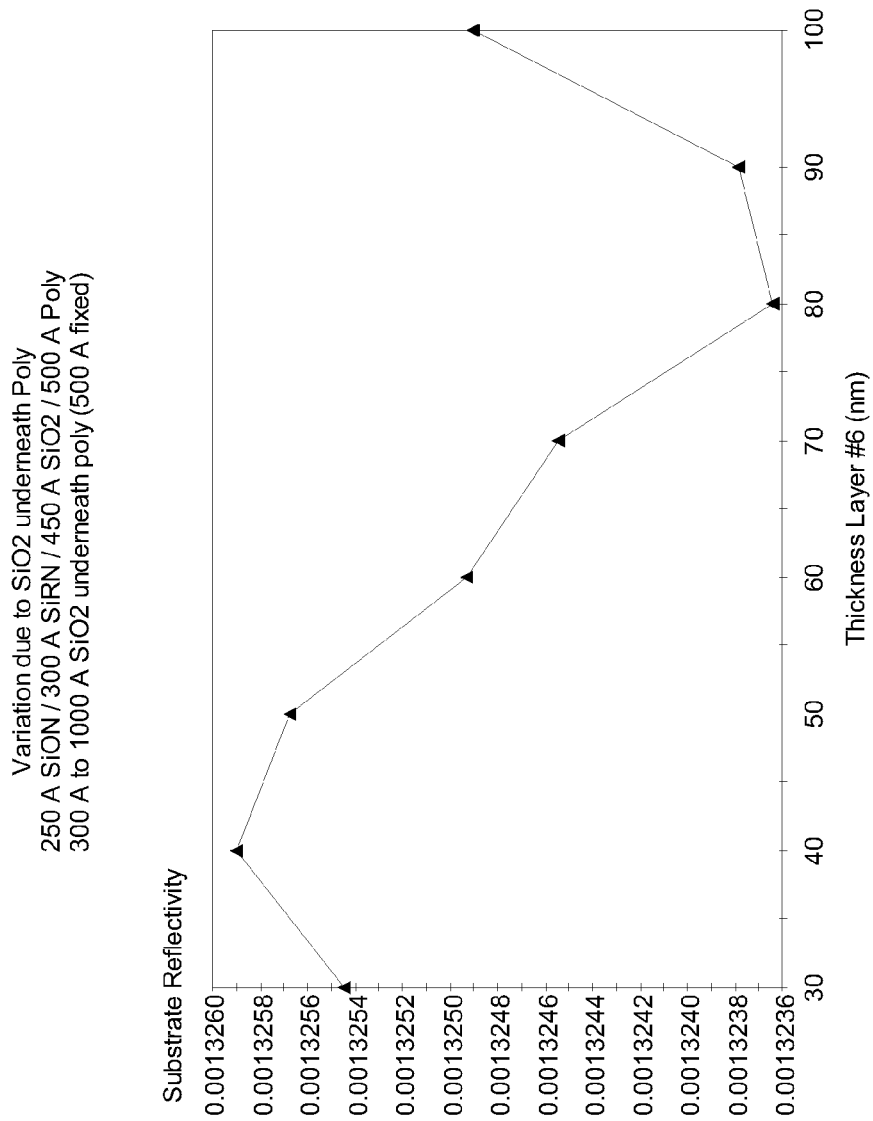
FIG. 41 is a graph showing substrate reflectivity versus the thickness of oxide below a 500 Å thick polysilicon layer.

With reference to FIG. 41, substrate reflectivity is shown with respect to the thickness of a silicon dioxide layer underneath layer 52. Layer 21 is a 250 Å SiON layer and layer 19 is a 300 Å SiRN layer. Layer 51 is a 450 Å SiO$_2$ layer with a 500 Å polysilicon layer 52. The layer underneath layer 52 is varied from 300 Å to 1000 Å. The effect of thickness of the layer underneath layer 52 is very close to zero.

Figure 42:
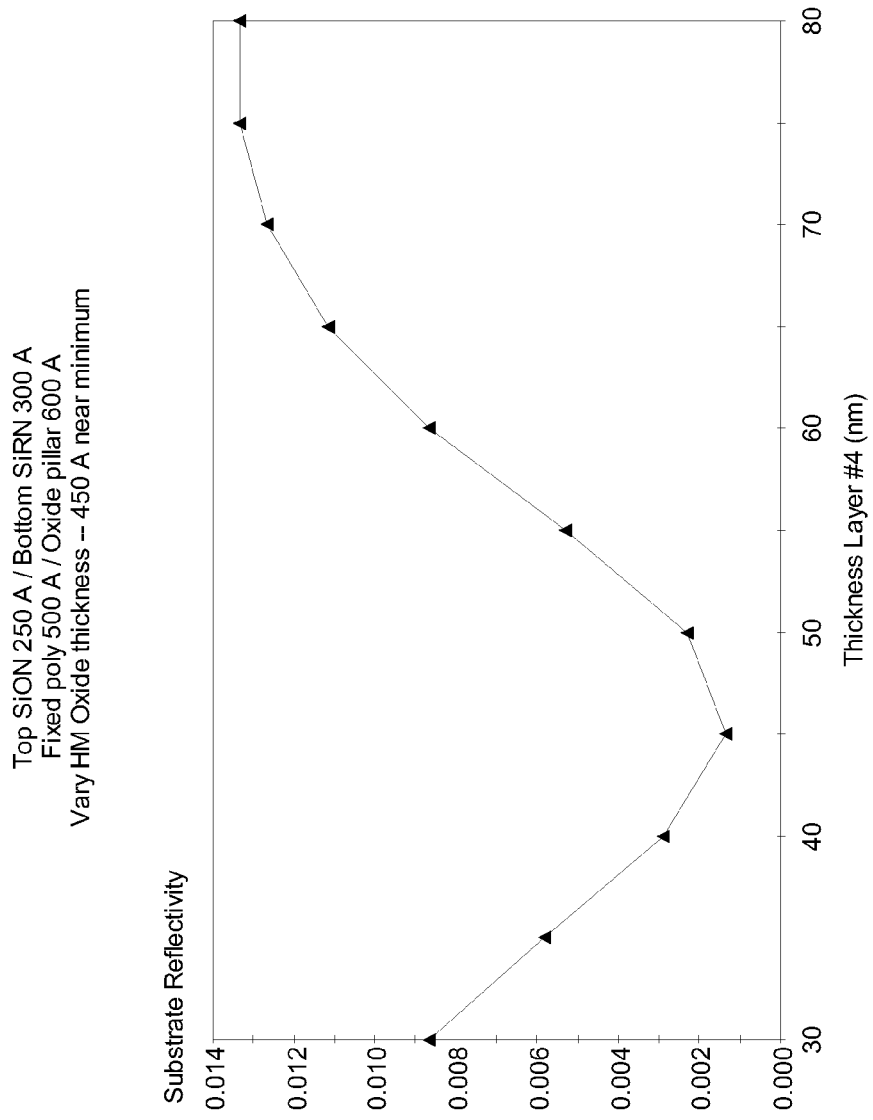
FIG. 42 is a graph showing substrate reflectivity versus the thickness of the oxide layer above a 500 Å thick polysilicon layer and 600 Å thick oxide layer using a 250 SiON top anti-reflective coating and a 300 Å bottom SiRN anti-reflective coating.

FIG. 42 shows substrate reflectivity with respect to the thickness of layer 51. Layer 21 is an SiON 250 Å thick layer, and layer 19 is a 300 Åthick SiRN layer. Layer 54 is a 500 Å thick poly layer above a 600 Å oxide layer. The thickness of layer 51 is varied from 300-800 Å. Reflectivity is a minimum of 0.15% at 450 Å.

Figure 43:
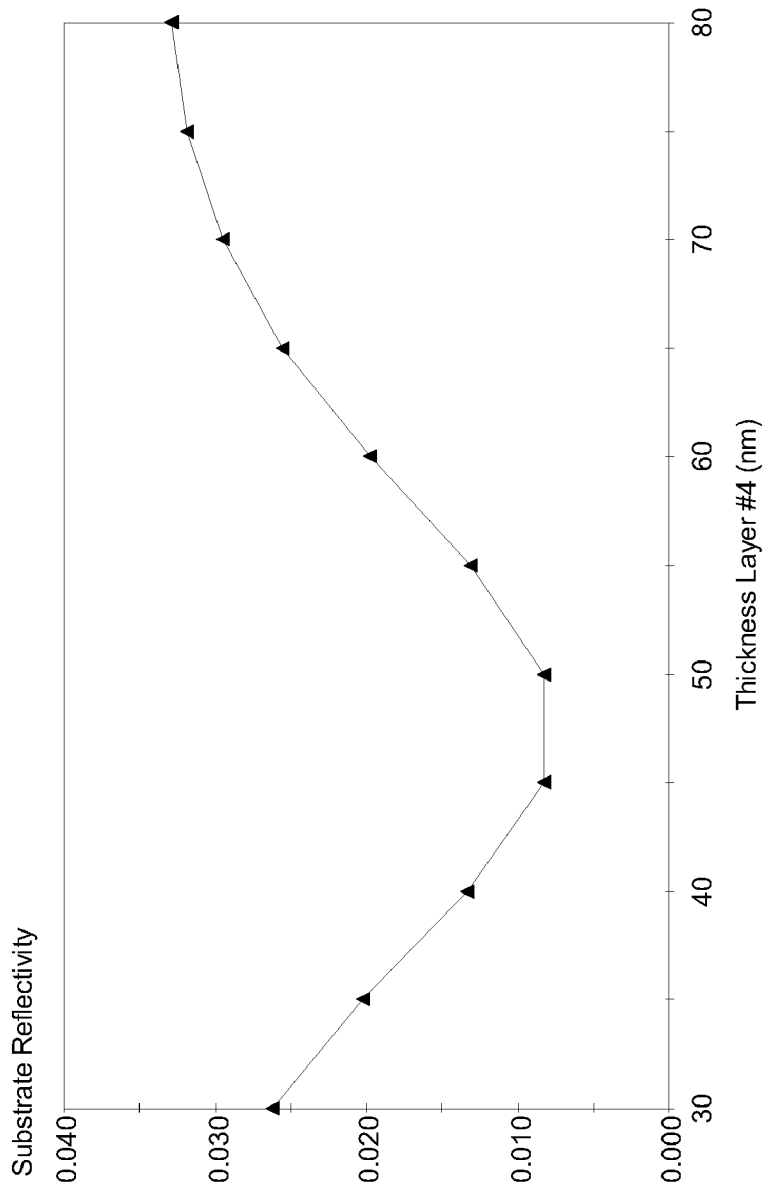
FIG. 43 is a graph showing substrate reflectivity versus the thickness of the oxide layer using a 200 Å SiON top anti-reflective coating and a 300 Å SiRN bottom anti-reflective coating.

With reference to FIG. 43, substrate reflectivity is shown with respect to the thickness of layer 51. Layer 21 is a 200 Å thick SiON layer and layer 19 is a 300 Å thick SiRN layer. Layer 54 is a 500 Å poly layer above a 600 Å oxide layer 52. Layer 51 has a thickness from 30 nm to 80 nm. A minimum reflectivity is shown at approximately 450-500 Å for layer 51.

Figure 44:
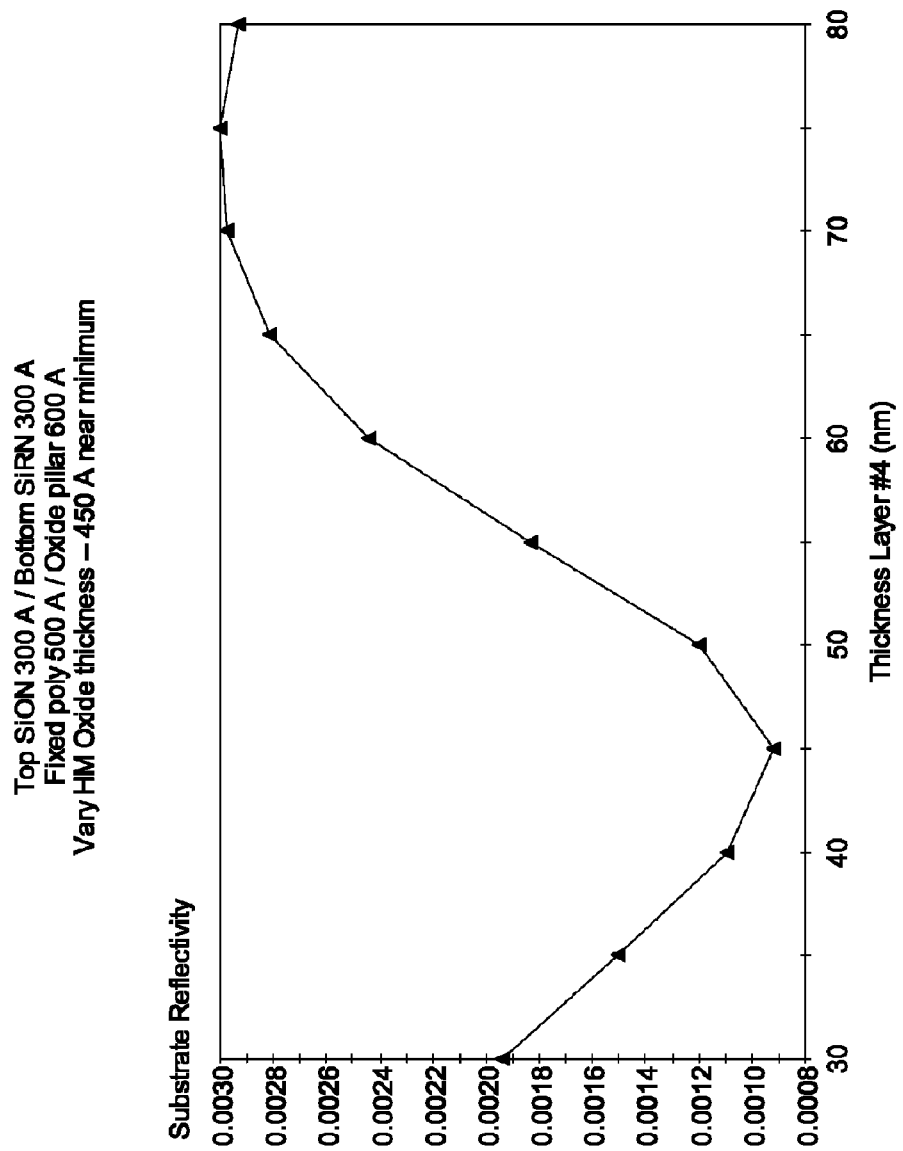
FIG. 44 is a graph showing substrate reflectivity versus the thickness of the oxide layer using a 300 Å SiON top anti-reflective coating and a 300 Å bottom SiRN bottom anti-reflective coating.

With reference to FIG. 44, substrate reflectivity is shown with respect to the thickness of layer 51. Layer 19 is a 300 Å thick SiON layer and layer 21 is a 300 Å thick SiRN layer. Layer 54 is a 500 Å poly layer above a 600 Å oxide layer. Layer 51 is a HM oxide layer. FIG. 44 shows a minimum reflectivity at approximately 450 Å. In FIGS. 41-44, reflectivity varies between 0.1% and 0.8% for HM thickness at 450 Å with layer 21 in a range of 250 Å plus/minus 50 Å and layer 19 fixed at 300 Å.

Figure 45:
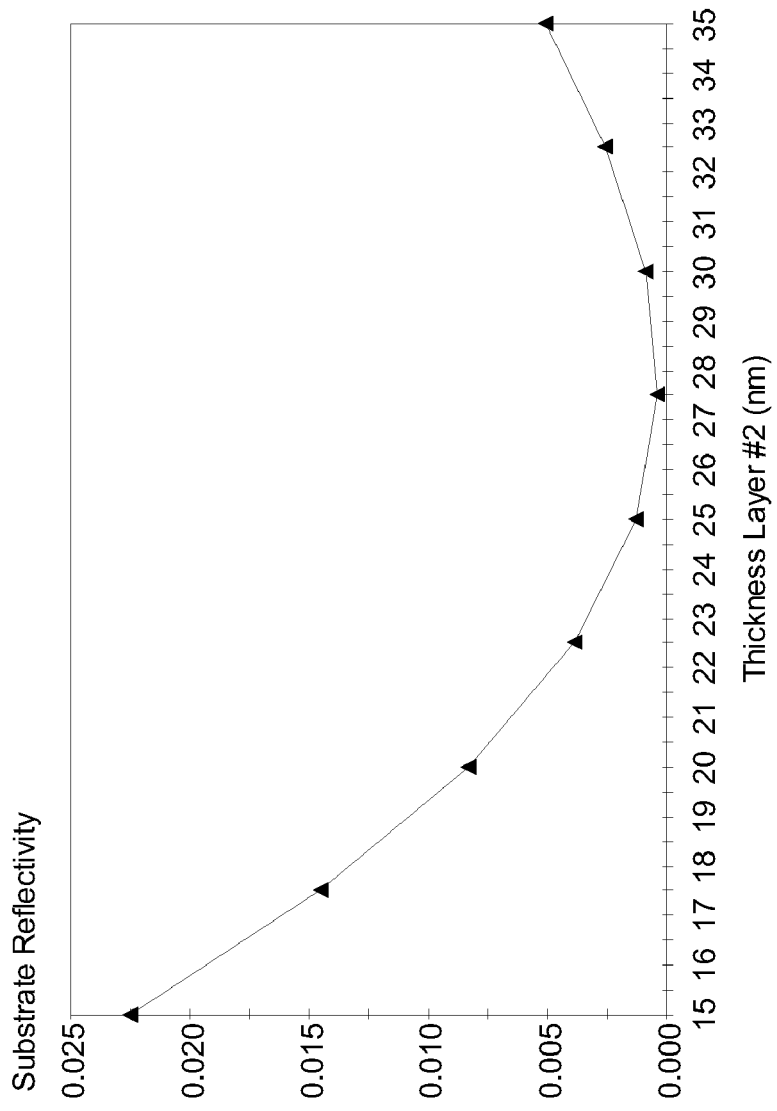
FIG. 45 is a graph showing substrate reflectivity versus the thickness of the top anti-reflective coating using a 450 Å thick oxide layer above a 500 Å polysilicon layer above a 600 Å oxide layer.

With reference to FIG. 45, substrate reflectivity is shown with respect to the thickness of layer 21. Layer 51 is a 450 Å thick oxide layer, and layer 54 is a 500 Å thick polysilicon layer above a 600 Å oxide layer. Layer 19 is a 300 Å SiRN BARC layer. The thickness of layer 21 is varied from 15 nm to 35 nm. FIG. 45 shows that a minimum is reached at approximately 250-300 Å thick layer for layer 21. The applicants have found optimal simulations as follows: 250 Å SiON for layer 21, 300 Å SiRN for layer 19, 500 Å of polysilicon for layer 54, and 450 Å for oxide HM for layer 51.

Figure 46:
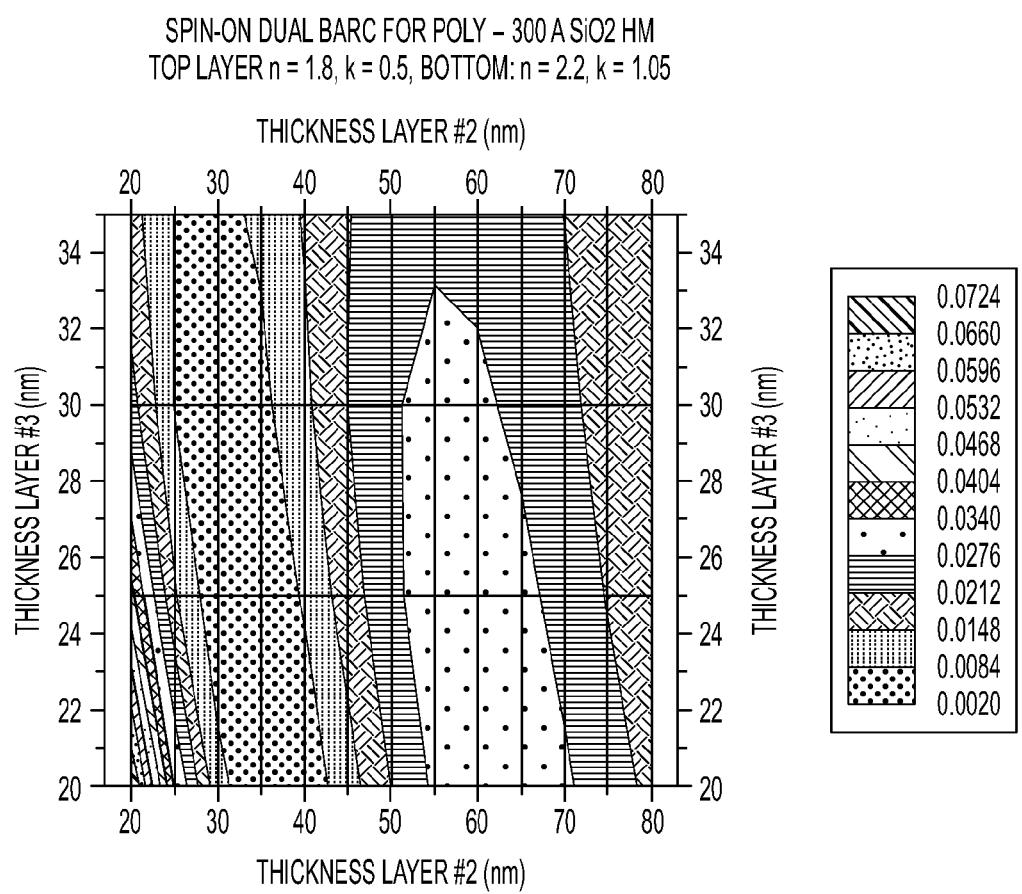
FIG. 46 is a graph showing reflectivity across a spectrum of thicknesses of the top anti-reflective coating and the bottom anti-reflective coating for a spin-on dual BARC structure above a 300 Å SiO$_2$ HM oxide layer above a polysilicon layer.

FIG. 46 shows reflectivity for a spin-on dual BARC structure 14 over silicon dioxide HM over polysilicon. Layer 21 is an organic spin-on BARC layer (n=1.8, k=0.5), and layer 19 is an SiRN layer (n=2.2, k=1.05). Minimum reflectivities are shown for thicknesses of layer 21 between 300 and 400 Å and layer 19 for thicknesses of 250-300 Å.

Figure 47:
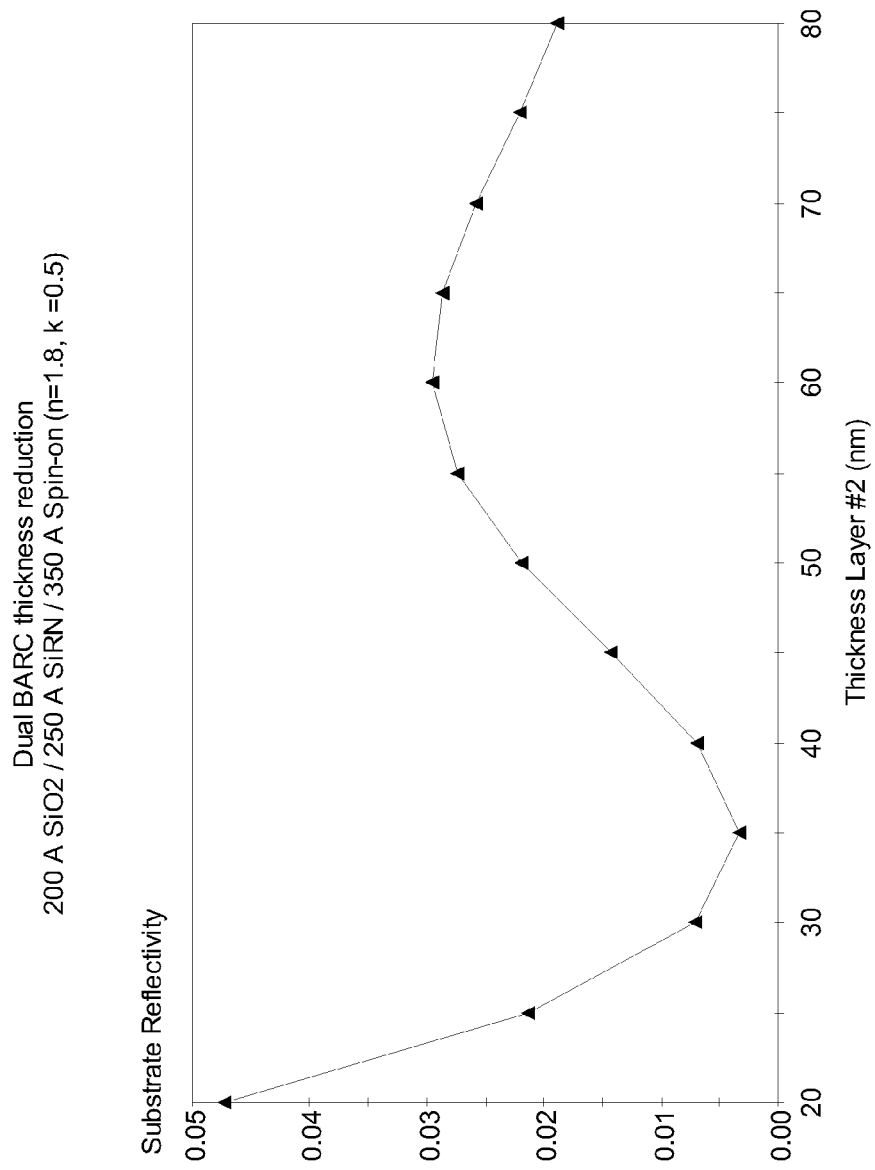
FIG. 47 is a graph showing substrate reflectivity versus the thickness of the top anti-reflective coating wherein the bottom anti-reflective coating is provided above a 200 Å silicon dioxide layer.

FIG. 47 shows substrate reflectivity versus a thickness of layer 21 for organic spin on BARC. Layer 21 is a spin-on Organic BARC layer. Layer 19 is a 250 Å SiRN layer above a 200 Å SiO$_2$ layer 51. Minimum reflectivity is associated with a thickness of 350 Å.

Figure 48:
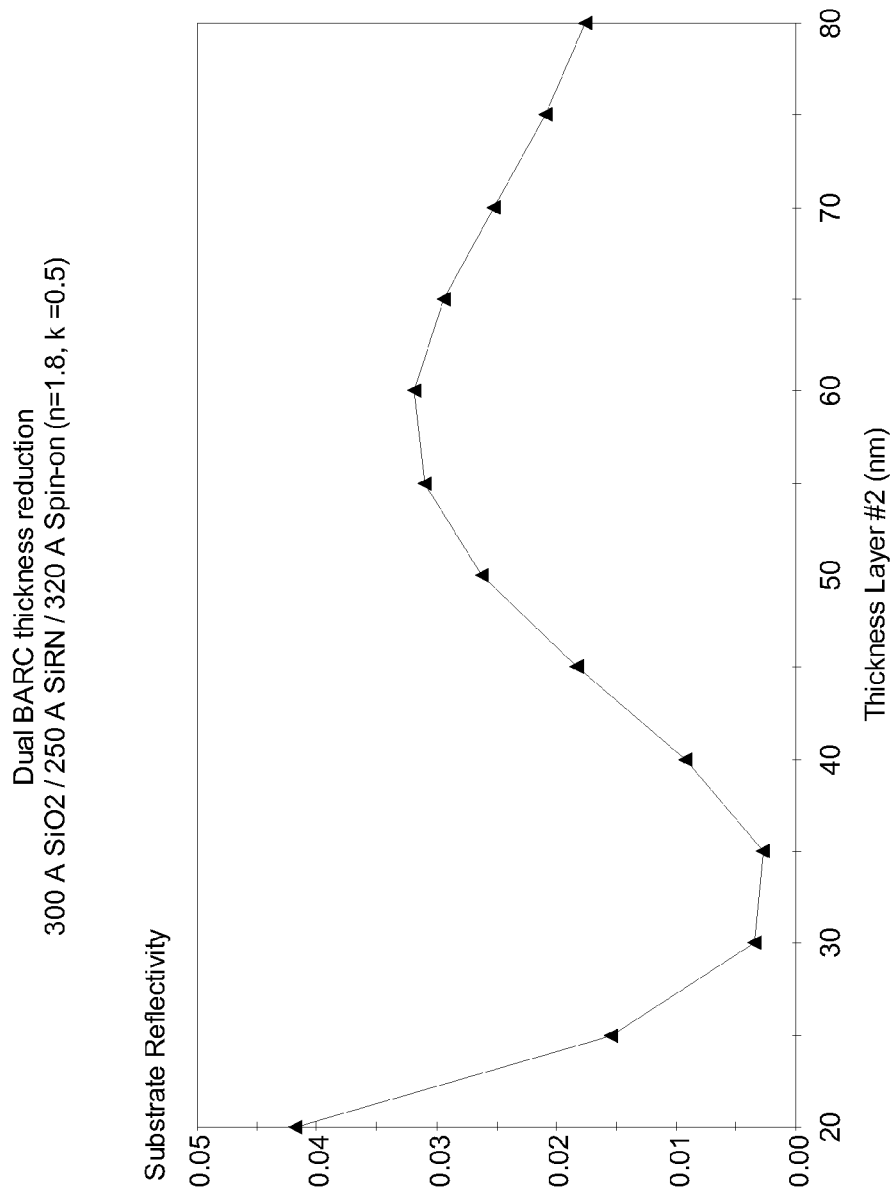
FIG. 48 is a graph showing substrate reflectivity versus the thickness of the first anti-reflective coating wherein the bottom anti-reflective coating is provided above a 300 Å silicon dioxide layer.

With reference to FIG. 48, substrate reflectivity is shown with respect to the thickness of layer 21. A 300 Å thick SiO$_2$ layer 51 is below a 250 Å thick SiRN layer 19. Layer 21 is preferably spun on (n=1.8, k=0.5). A reflectivity minimum is shown between 300 and 350 Å for layer 21.

Figure 49:
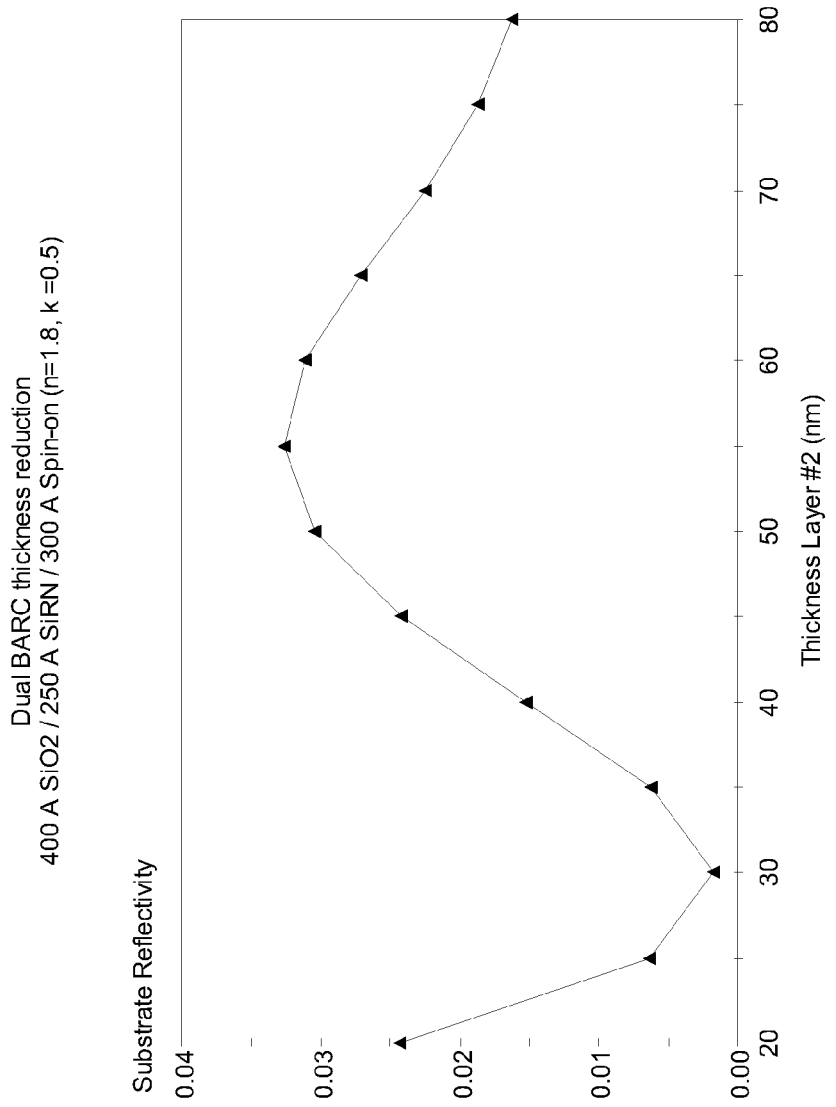
FIG. 49 is a graph showing substrate reflectivity versus the thickness of the top anti-reflective coating wherein the bottom anti-reflective coating is provided above a 400 Å silicon dioxide layer.

With reference to FIG. 49, reflectivity is shown with respect to the thickness of layer 21. Layer 51 is 400 Å SiO2 layer. Layer 19 is a 250 ÅSiRN layer. Layer 21 is preferably spun on (n=1.8, k=0.5). FIG. 49 shows a minimum reflectivity at approximately 300 Å.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of ARC materials and thicknesses processes are mentioned, other materials and process steps can be utilized. Various changes may be made to the details disclosed without departing from the spirit of the invention which is defined by the following claims.

What is claimed is:

1. A method of forming a gate stack for an integrated circuit, the method comprising:
   forming an oxide layer above a gate conductor layer and a substrate;
   forming a first anti-reflective coating layer and a second anti-reflective coating layer above the oxide layer;
   forming a photoresist layer over the second anti-reflective coating layer;
   patterning the photoresist layer to form a first feature in the photoresist layer at a high numerical aperture;
   selectively removing the first and second anti-reflective layers in accordance with the first feature;
   forming a spacer layer;
   etching the spacer layer; and
   etching the oxide layer and the gate conductor layer to form the gate stack.

2. The method of claim 1, wherein the second anti-reflective coating layer has a thickness of approximately 250 Å.

3. The method of claim 2, wherein the first anti-reflective coating layer has a thickness of approximately 300 Å.

4. The method of claim 3, wherein the first anti-reflective coating layer includes silicon oxynitride.

5. The method of claim 4, further comprising forming the gate conductor layer above the substrate, the first anti-reflective coating layer being formed above the gate conductor layer.

6. The method of claim 4, wherein the photoresist layer is high contrast ARF, KRF, or I-line resist.

7. The method of claim 1, further comprising:
   forming the spacer layer after selectively removing the first and second anti-reflective coating layers; and
   etching the spacer layer before etching the gate conductor layer.

8. The method of claim 1, further comprising:
   etching the gate conductor layer above the substrate in accordance with the first anti-reflective coating layer, the second anti-reflective coating layer, and the spacer layer.

9. The method of claim 1, wherein the first anti-reflective coating layer includes at least one of $Si_3N_4$, SiOC, SiRN, and SiON, wherein the second anti-reflective coating layer includes at least one of organic spin on antireflective material, SiOC, SiRN and SiON.

10. The method of claim 1, wherein the first anti-reflective coating layer is applied to the oxide layer and includes silicon rich nitride.

* * * * *